United States Patent
Ono et al.

(10) Patent No.: US 9,236,454 B2
(45) Date of Patent: Jan. 12, 2016

(54) METHOD OF MANUFACTURING THIN-FILM TRANSISTOR, THIN-FILM TRANSISTOR, DISPLAY APPARATUS, SENSOR, AND DIGITAL X-RAY IMAGE-CAPTURING APPARATUS

(71) Applicant: FUJIFILM Corporation, Minato-ku, Tokyo (JP)

(72) Inventors: Masashi Ono, Ashigarakami-gun (JP); Masahiro Takata, Ashigarakami-gun (JP); Atsushi Tanaka, Ashigarakami-gun (JP); Masayuki Suzuki, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/963,061

(22) Filed: Aug. 9, 2013

(65) Prior Publication Data

US 2013/0320338 A1 Dec. 5, 2013

Related U.S. Application Data

(63) Continuation of application No. PCT/JP2012/054318, filed on Feb. 22, 2012.

(30) Foreign Application Priority Data

Mar. 11, 2011 (JP) ................................. 2011-054718

(51) Int. Cl.
*H01L 29/10* (2006.01)
*H01L 29/66* (2006.01)
(Continued)

(52) U.S. Cl.
CPC .......... *H01L 29/66969* (2013.01); *C23C 14/08* (2013.01); *C23C 14/3464* (2013.01);
(Continued)

(58) Field of Classification Search
CPC .................. H01L 21/02554; H01L 21/02565; H01L 21/02631; H01L 27/14612; H01L 27/14658; H01L 27/14692; H01L 29/66969; H01L 29/78693
USPC .......................... 438/85, 86, 104, 754; 257/43
See application file for complete search history.

(56) References Cited

U.S. PATENT DOCUMENTS

2006/0108529 A1 5/2006 Saito et al.
2008/0251729 A1 10/2008 Saito et al.
(Continued)

FOREIGN PATENT DOCUMENTS

| JP | 2006-165530 A | 6/2006 |
|---|---|---|
| JP | 2008-053356 A | 3/2008 |
| JP | 2010-238770 A | 10/2010 |
| JP | 2011-014761 A | 1/2011 |
| JP | 2011-035389 A | 2/2011 |

OTHER PUBLICATIONS

Yutomo Kikuchi, et al., "Device characteristics improvement of a-In—Ga—Zn—O TFTs by low-temperature annealing", Thin Solid Films, Oct. 28, 2010, pp. 3017-3021, vol. 518.
(Continued)

*Primary Examiner* — Hung Vu
(74) *Attorney, Agent, or Firm* — Sughrue Mion, PLLC

(57) ABSTRACT

A method of fabricating a thin-film transistor, the method including: film-forming an active layer, that contains as a main component thereof an oxide semiconductor structured by O and at least two elements among In, Ga and Zn, in a film formation chamber into which at least oxygen is introduced, and b) heat treating the active layer at less than 300° C. in a dry atmosphere, wherein the film-forming a) and the heat treating are carried out such that, given that an oxygen partial pressure with respect to an entire pressure of an atmosphere within the film formation chamber in the film-forming is $PO_2\text{depo}$ (%), and an oxygen partial pressure with respect to an entire pressure of an atmosphere during the heat treating is $PO_2\text{anneal}$ (%), the oxygen partial pressure $PO_2\text{anneal}$ (%) at the time of the heat treating b) satisfies a relationship: $-20/3PO_2\text{depo}+40/3 \leq PO_2\text{anneal} \leq -800/43PO_2\text{depo}+5900/43$.

14 Claims, 17 Drawing Sheets

(51) Int. Cl.
*H01L 21/02* (2006.01)
*H01L 27/146* (2006.01)
*H01L 29/786* (2006.01)
*C23C 14/08* (2006.01)
*C23C 14/34* (2006.01)
*C23C 14/58* (2006.01)
*G02F 1/1333* (2006.01)
*G02F 1/1368* (2006.01)

(52) U.S. Cl.
CPC ......... *C23C14/5806* (2013.01); *C23C 14/5853* (2013.01); *H01L 21/02554* (2013.01); *H01L 21/02565* (2013.01); *H01L 21/02631* (2013.01); *H01L 27/14612* (2013.01); *H01L 27/14658* (2013.01); *H01L 27/14692* (2013.01); *H01L 29/78693* (2013.01); *G02F 1/133305* (2013.01); *G02F 2001/13685* (2013.01)

(56) References Cited

U.S. PATENT DOCUMENTS

2008/0290286 A1  11/2008  Saito et al.
2009/0146072 A1   6/2009  Saito et al.
2011/0008931 A1*  1/2011  Yamazaki et al. ............ 438/104

OTHER PUBLICATIONS

International Search Report for PCT/JP2012/054318 dated Mar. 27, 2012.
Written Opinion for PCT/JP2012/054318 dated Mar. 27, 2012.
Notice of Reasons for Rejection, dated Apr. 22, 2014, issued in corresponding JP Application No. 2011-054718, 4 pages in English and Japanese.
Korean Office Action, dated Sep. 16, 2015, issued in corresponding KR Application No. 10-2013-7022092, 7 pages in English and Korean.

* cited by examiner

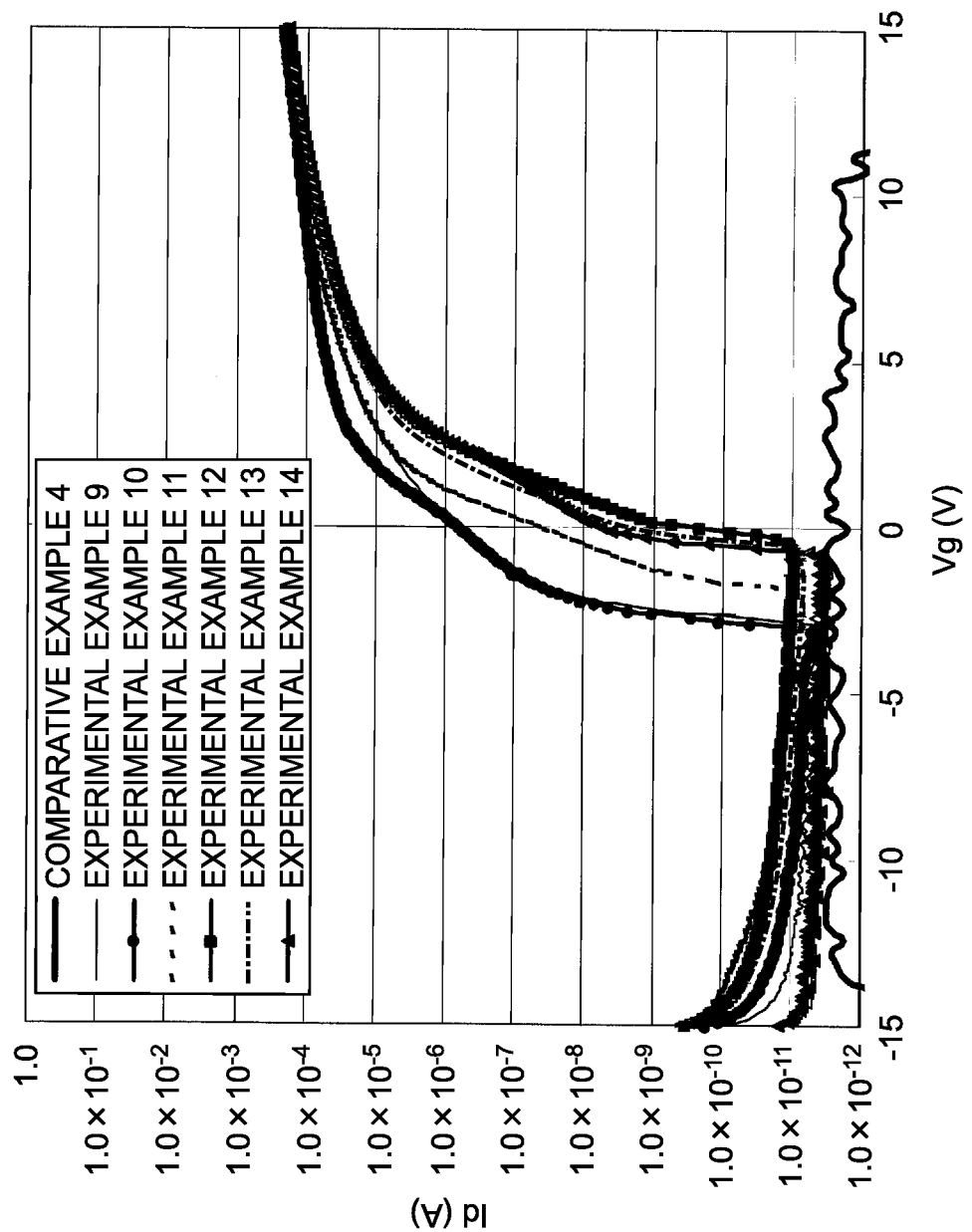

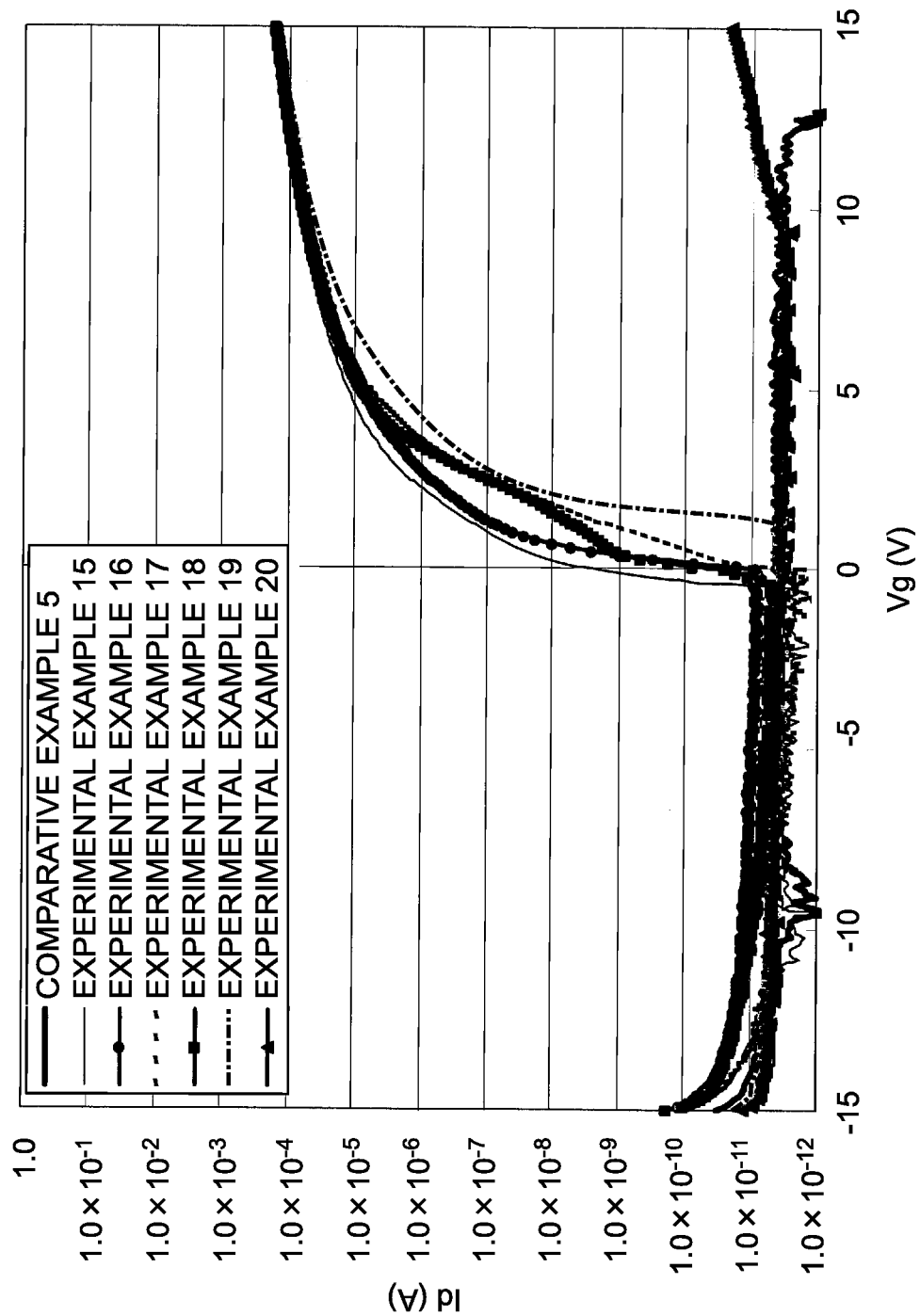

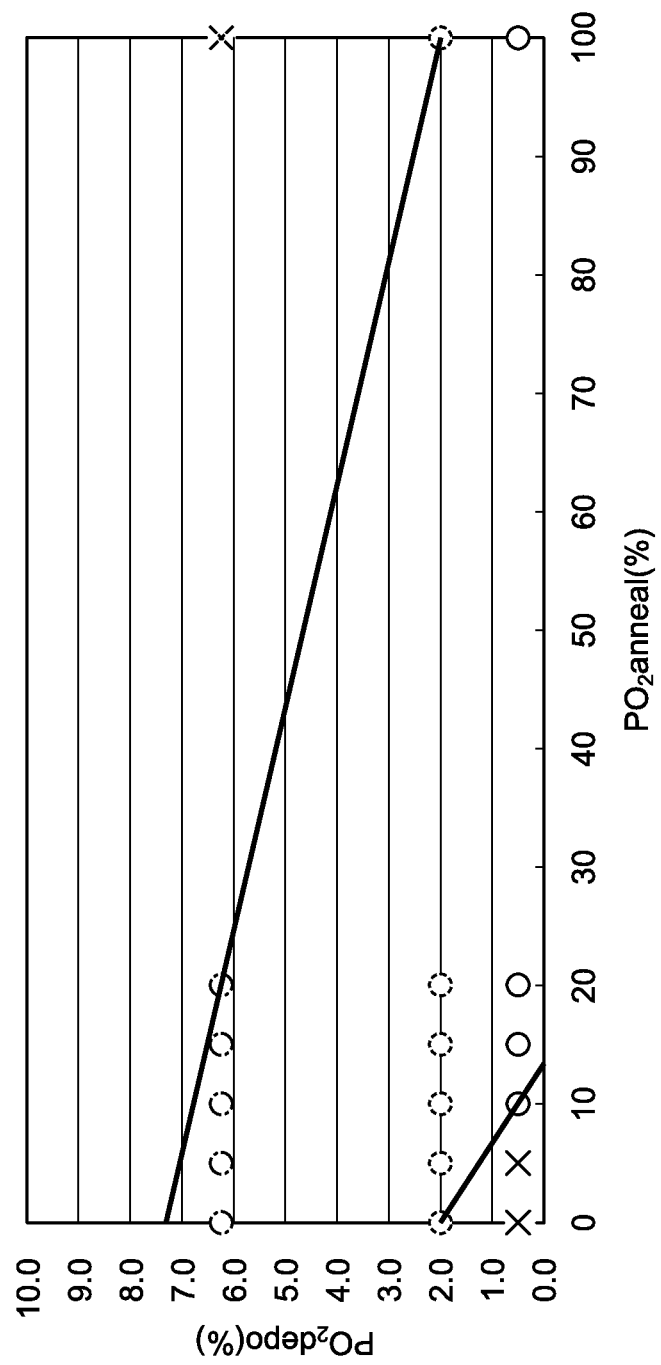

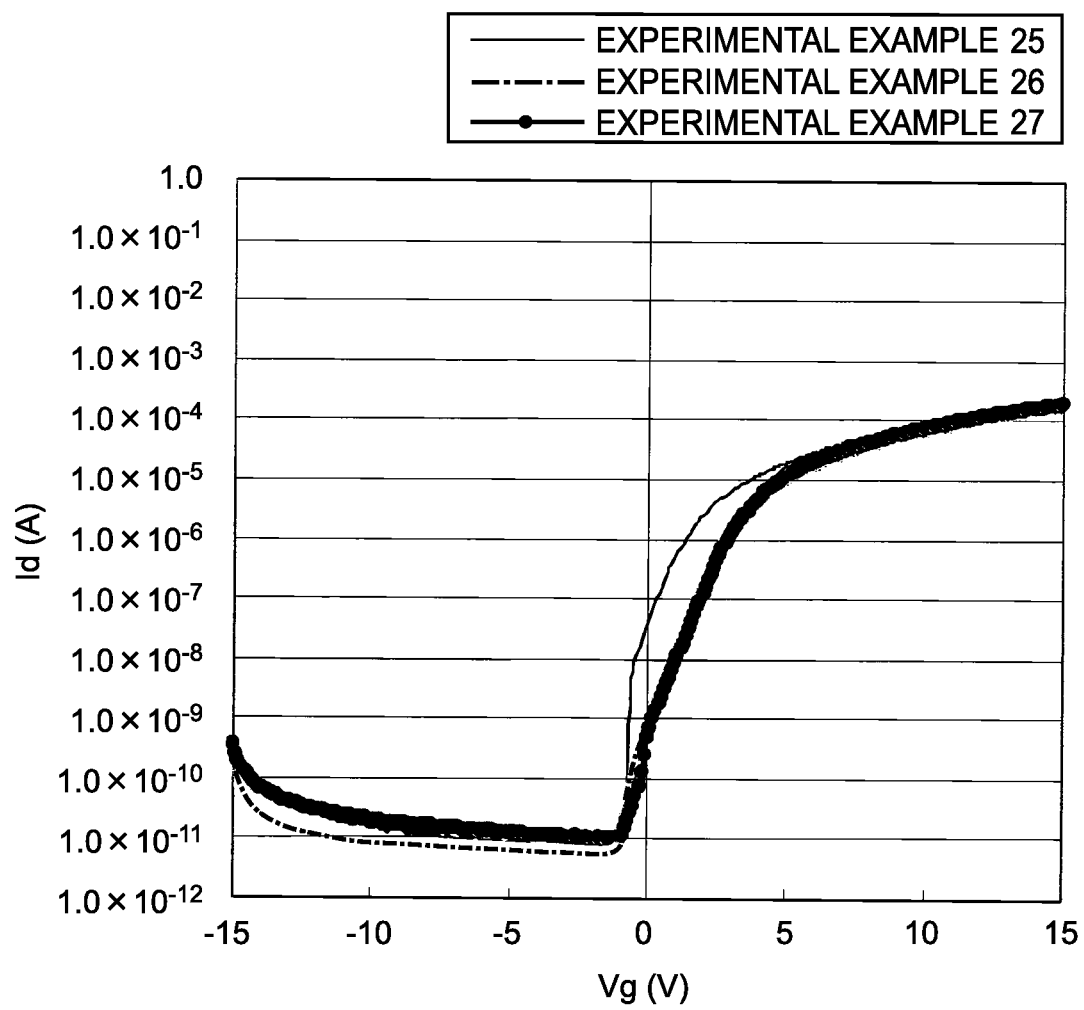

METHOD OF MANUFACTURING THIN-FILM TRANSISTOR, THIN-FILM TRANSISTOR, DISPLAY APPARATUS, SENSOR, AND DIGITAL X-RAY IMAGE-CAPTURING APPARATUS

CROSS-REFERENCE TO RELATED APPLICATIONS

This application is a continuation application of International Application No. PCT/JP2012/054318, filed Feb. 22, 2012, the disclosure of which is incorporated herein by reference in its entirety. Further, this application claims priority from Japanese Patent Application No. 2011-054718, filed Mar. 11, 2011, the disclosure of which is incorporated herein by reference in its entirety.

BACKGROUND

1. Technical Field

The present invention relates to a method of fabricating a thin-film transistor, a thin-film transistor, a display device, a sensor, and an X-ray digital imaging device.

2. Related Art

The research and development of thin-film transistors that use an In—Ga—Zn—O (hereinafter called IGZO) oxide semiconductor thin film at the active layer (channel layer) has been flourishing in recent years. Oxide semiconductor thin films can be formed at low temperatures, and exhibit higher mobility than amorphous silicon, and further, are transparent with respect to visible light. Therefore, a flexible thin-film transistor can be formed on a substrate such as a plastic plate or a film or the like.

Here, a comparative table of the field effect mobilities, process temperatures and the like, that are characteristics of respective types of transistors, is shown as Table 1.

TABLE 1

|  | LTPS low temperature polysilicon | a-Si:H | μC—Si:H | Organic-TFT | Oxide-TFT |
|---|---|---|---|---|---|
| mobility | 100 | <1 | 2~3 | <1~5 | 3~50 |
| stability $\Delta V_{TH}$ | <1 | 100 | 1~2 | 30 | 1~2 |
| uniformity | Δ | ○ | ○? | Δ | ○? |
| film formation temperature | 450 | 300 | 300 | RT~100 | RT~350 |

As shown in Table 1, at a thin-film transistor whose active layer is polysilicon, a mobility of around 100 cm$^2$/Vs can be obtained, but the process temperature is greater than or equal to 450° C. which is extremely high. Therefore, a thin-film transistor whose active layer is polysilicon can only be formed on substrates having high heat resistance, and is not suited to low costs, large surface areas, and making structures flexible. Further, because a thin-film transistor whose active layer is amorphous silicon can be formed at a relatively low temperature of around 300° C., the selectivity of substrates is broad as compared with polysilicon, but only a mobility of around 1 cm$^2$/Vs at best can be obtained, and a thin-film transistor whose active layer is amorphous silicon is not suited to high-definition display applications. On the other hand, from the standpoint of low-temperature film formation, thin-film transistors whose active layer is an organic substance can be formed at less than or equal to 100° C., and therefore, application to flexible display applications using a plastic film substrate or the like that has low heat resistance, or the like, is anticipated, but with regard to the mobility, only effects that are of the same extent as those of amorphous silicon can be obtained.

In the fabrication process, carrying out a heat treatment (post-annealing processing) after element formation in order to improve the electrical characteristics of the transistor is often seen. At a thin-film transistor using an oxide semiconductor thin film at the active layer, a device exhibiting high mobility and high reliability can be formed even by low-temperature formation as described above, and lowering of the temperature at the time of the heat treatment is anticipated.

In a thin-film transistor using an IGZO oxide semiconductor thin film at the active layer, several methods for controlling to the desired electrical characteristics by a heat treatment have been reported.

Japanese Patent Application Laid-Open No. 2008-53356 discloses, in a thin-film transistor whose active layer is IGZO, carrying out a heat treatment in a temperature range of 250° C. to 450° C. after active layer formation. Further, carrying out a heat treatment in a temperature range of 150° C. to 450° C. while irradiating oxygen radicals and ozone is also disclosed.

Japanese Patent Application Laid-Open No. 2010-238770 discloses, in a thin-film transistor whose active layer is IGZO, carrying out a heat treatment in a temperature range of 200° C. to 500° C. after active layer formation. Further, as an example of this method, in Example 3 of Japanese Patent Application Laid-Open No. 2010-238770, there is disclosed film forming an active layer that is formed from IGZO in a mixed gas atmosphere of oxygen and argon having an oxygen concentration of 1%, and thereafter, carrying out a heat treatment at 300° C. in an atmosphere of 100%.

However, in Japanese Patent Application Laid-Open No. 2008-53356 and Japanese Patent Application Laid-Open No. 2010-238770, when carrying out a heat treatment at a high temperature of 300° C. or more, there is the problem that, from the standpoint of heat resistance, it is difficult to use such methods for transistors that are formed on flexible substrates such as plastic substrates or the like. Further, when carrying out a heat treatment at a low temperature of less than 300° C., lowering of the resistance may occur, and therefore, it is difficult to obtain a normally-off transistor merely by simply adjusting the heat treatment temperature. Moreover, when carrying out a heat treatment at a low temperature of less than 300° C., the electric field mobility is, for example, around 7.1 cm$^2$/Vs (refer to Experimental Example 3 of Japanese Patent Application Laid-Open No. 2010-238770), and is not greater than or equal to 10 cm$^2$/Vs. Still further, when carrying out a heat treatment while irradiating oxygen radicals and ozone as in Japanese Patent Application Laid-Open No. 2008-53356, high stability at a temperature range of 150° C. to 450° C. is obtained, but the process becomes complex.

SUMMARY

The present invention was made in view of the above-described circumstances, and an object thereof is to provide a method of fabricating a thin-film transistor that has high electric field mobility and is normally-off while the selectivity of the substrate is broadened, and a thin-film transistor, a display device, a sensor, and an X-ray digital imaging device.

The above-described problems to be solved of the present invention are solved by the following means.

<1> A method of fabricating a thin-film transistor, comprising: a film-forming step of film-forming an active layer, that contains as a main component thereof an oxide semiconductor structured by O and at least two elements among In, Ga and Zn, in a film formation chamber into which at least oxygen is introduced, and a heat treatment step of subjecting the active layer to a heat treatment at less than 300° C. in a dry atmosphere, wherein the film-forming step and the heat treatment step are carried out such that, given that an oxygen partial pressure with respect to an entire pressure of an atmosphere within the film formation chamber in the film-forming step is $PO_2depo$ (%), and an oxygen partial pressure with respect to an entire pressure of an atmosphere during the heat treatment step is $PO_2anneal$ (%), the oxygen partial pressure $PO_2anneal$ (%) at the time of the heat treatment step satisfies a relationship $-20/3PO_2depo+40/3 \leq PO_2anneal \leq -800/43PO_2depo+5900/43$.

<2> The method of fabricating a thin-film transistor of <1>, wherein, in the film-forming step, the oxygen partial pressure $PO_2depo$ is greater than or equal to 0.17%.

<3> The method of fabricating a thin-film transistor of <2>, wherein, in the film-forming step, the oxygen partial pressure $PO_2depo$ is greater than or equal to 0.50%.

<4> The method of fabricating a thin-film transistor of any one of <1> through <3>, wherein, in the film-forming step, the oxygen partial pressure $PO_2depo$ is less than or equal to 6.3%.

<5> The method of fabricating a thin-film transistor of any one of <1> through <4>, wherein, in the heat treatment step, a heat treatment temperature exceeds 150° C.

The invention of <6> is the method of fabricating a thin-film transistor of any one of <1> through <5>, wherein, in the heat treatment step, a heat treatment temperature is less than or equal to 250° C.

<7> The method of fabricating a thin-film transistor of any one of <1> through <6>, wherein the oxide semiconductor is structured of In, Ga, Zn and O, and a mol ratio of the Ga with respect to a total of a mol ratio of the In and the mol ratio of the Ga satisfies a relationship $0.375 \leq Ga/(In+Ga) \leq 0.625$.

<8> The method of fabricating a thin-film transistor of any one of <1> through <7>, wherein, in the film-forming step, the active layer is film-formed by a sputtering method.

<9> A thin-film transistor fabricated by using the method of fabricating a thin-film transistor of any one of <1> through <8>, wherein a number of $H_2O$ molecules, observed by thermal desorption spectrometry, of the active layer is less than or equal to $4.2 \times 10^{20}$ $cm^{-3}$.

<10> The thin-film transistor of <9>, wherein the active layer is formed on a substrate that is flexible.

<11> A display device comprising the thin-film transistor of <9> or <10>.

<12> A sensor comprising the thin-film transistor of <9> or <10>.

<13> An X-ray digital imaging device comprising the sensor of <12>.

Advantageous Effects of Invention

In accordance with the present invention, there can be provided a method of fabricating a thin-film transistor that has high electric field mobility and is normally-off while the selectivity of the substrate is broadened, and a thin-film transistor, a display device, a sensor, and an X-ray digital imaging device.

BRIEF DESCRIPTION OF THE DRAWINGS

FIG. 1A is a cross-sectional view schematically showing the structure of a top gate/top contacting type thin-film transistor, FIG. 1B is a cross-sectional view schematically showing the structure of a top gate/bottom contacting type thin-film transistor, FIG. 1C is a cross-sectional view schematically showing the structure of a bottom gate/top contacting type thin-film transistor, and FIG. 1D is a cross-sectional view schematically showing the structure of a bottom gate/bottom contacting type thin-film transistor.

FIG. 11B is a drawing showing the Vg-Id characteristics in Experimental Examples 9 through 13 ($PO_2depo=2.0\%$).

FIG. 11C is a drawing showing the Vg-Id characteristics in Experimental Examples 15 through 20 ($PO_2depo=6.3\%$).

FIG. 12 is a drawing showing the relationship between oxygen partial pressure at the time of active layer film formation and oxygen partial pressure at the time of a heat treatment.

FIG. 13B is a drawing showing the Vg-Id characteristics in Experimental Examples 25 through 27 (annealing temperature 200° C.).

DETAILED DESCRIPTION

Figure 1A:
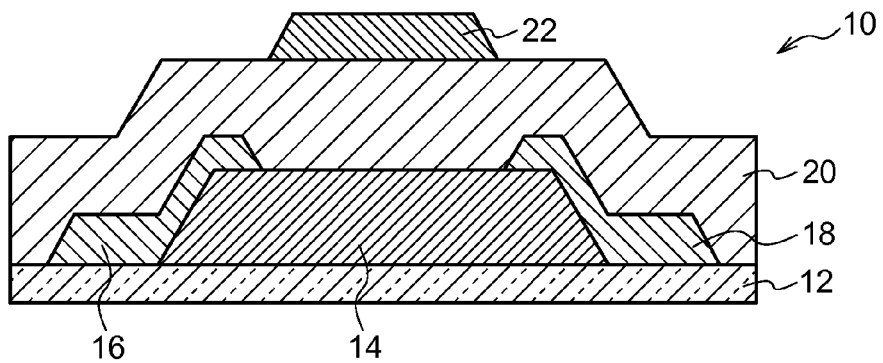
FIGS. 1A-1D are drawings showing thin-film transistors of an embodiment, where

A method of fabricating a thin-film transistor, a thin-film transistor, a display device, a sensor, and an X-ray digital imaging device relating to embodiments of the present invention are described concretely hereinafter with reference to the appended drawings. Note that, in the drawings, members (structural elements) that have the same or corresponding functions are denoted by the same reference numerals and description is omitted appropriately.

<Summary of Thin-Film Transistor>

First, a summary of a thin-film transistor that is fabricated by a method of fabricating a thin-film transistor relating to an embodiment of the present invention is described. The thin-film transistor (hereinafter abbreviated as TFT) relating to an embodiment of the present invention is an active element that has a gate electrode, a gate insulating film, an active layer, a source electrode and a drain electrode, and that applies voltage to the gate electrode, and controls the current flowing to the active layer, and has the function of switching current between the source electrode and the drain electrode.

The element structure of the TFT may be either of a so-called reverse staggered structure (also called bottom gate type) or a staggered structure (also called top gate type), that are based on the position of the gate electrode. Further, the TFT may be either of a so-called top contacting type or bottom contacting type, that is based on the contacting portions of the active layer and the source electrode and the drain electrode (hereinafter called "source/drain electrodes" when appropriate).

Note that a top gate type is a form in which the gate electrode is disposed at the upper side of the gate insulating film, and the active layer is formed at the lower side of the gate insulating film. A bottom gate type is a form in which the gate electrode is disposed at the lower side of the gate insulating film, and the active layer is formed at the upper side of the gate insulating film. Further, a bottom contacting type is a form in which the source/drain electrodes are formed before the active layer, and the bottom surface of the active layer contacts the source/drain electrodes. A top contacting type is a form in which the active layer is formed before the source/drain electrodes, and the top surface of the active layer contacts the source/drain electrodes.

FIG. 1A is a schematic drawing showing an example of a TFT that has a top gate structure and is a top contacting type, and that is a TFT relating to an embodiment of the present invention. In a TFT 10 shown in FIG. 1A, an active layer 14 is layered on one main surface of a substrate 12. Further, a source electrode 16 and a drain electrode 18 are set so as to be apart from one another on this active layer 14, and further, a gate insulating film 20 and a gate electrode 22 are layered in order on these.

Figure 1B:
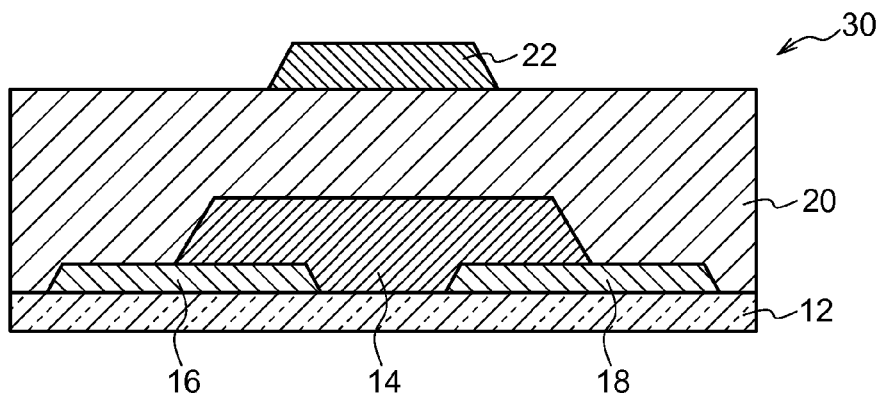

FIG. 1B is a schematic drawing showing an example of a TFT that has a top gate structure and is a bottom contacting type, and that is a TFT relating to an embodiment of the present invention. In a TFT 30 shown in FIG. 1B, the source electrode 16 and the drain electrode 18 are set so as to be apart from one another on one main surface of the substrate 12. Further, the active layer 14, the gate insulating film 20, and the gate electrode 22 are layered in order.

Figure 1C:
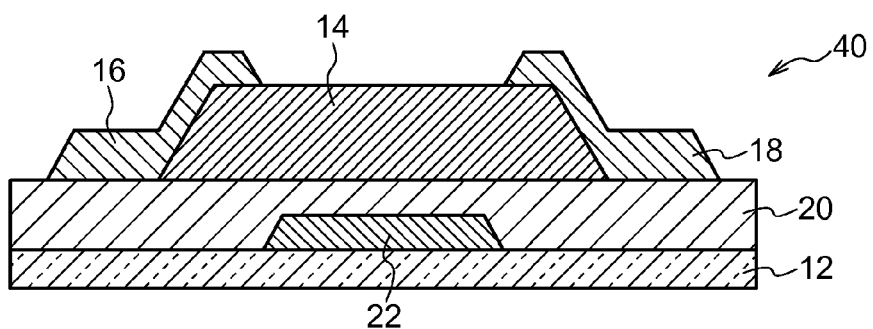

FIG. 1C is a schematic drawing showing an example of a TFT that has a bottom gate structure and is a top contacting type, and that is a TFT relating to an embodiment of the present invention. In a TFT 40 shown in FIG. 1C, the gate electrode 22, the gate insulating film 20, and the active layer 14 are layered in order on one main surface of the substrate 12. Further, the source electrode 16 and the drain electrode 18 are set so as to be apart from one another on the surface of this active layer 14.

Figure 1D:
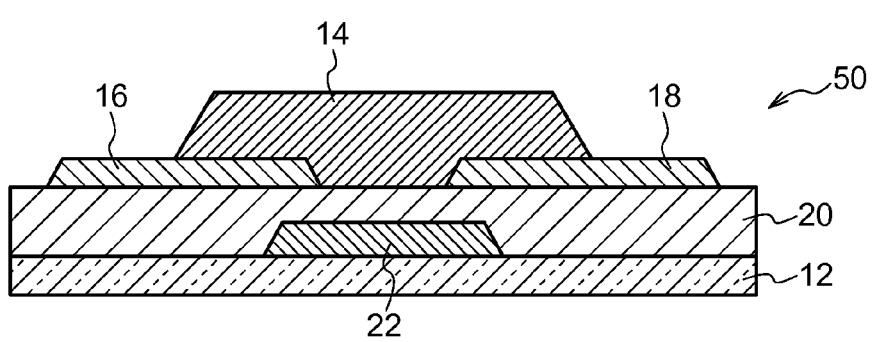

FIG. 1D is a schematic drawing showing an example of a TFT that has a bottom gate structure and is a bottom contacting type, and that is a TFT relating to an embodiment of the present invention. In a TFT 50 shown in FIG. 1D, the gate electrode 22 and the gate insulating film 20 are layered in order on one main surface of the substrate 12. Further, the source electrode 16 and the drain electrode 18 are set so as to be apart from one another on the surface of this gate insulating film 20, and moreover, the active layer 14 is layered on these.

Note that the TFT relating to the present embodiment can be made to be various structures other than those described above, and may be a structure that appropriately has a protective layer on the active layer, or an insulating layer on the substrate, or the like.

The respective structural elements are described in detail hereinafter. Note that a case of fabricating the TFT 10, that has a top gate structure and is a top contacting type and is shown in FIG. 1A, is described concretely as a representative example, but the present invention can similarly be applied also to cases of fabricating TFTs of other forms.

<Detailed Structure of TFT>
—Substrate—

The shape, structure, size and the like of the substrate 12 for forming the TFT 10 are not particularly limited, and can be selected appropriately in accordance with the object. The structure of the substrate 12 may be a single-layer structure or may be a layered structure.

As the substrate 12, for example, substrates formed from inorganic materials such as glass, YSZ (yttria-stabilized zirconium) and the like, or resin or resin composite materials, or the like can be used. Among these, from the standpoint of being light weight and from the standpoint of having flexibility, substrates formed from resin or resin composite materials are preferable. Concretely, substrates formed from fluorine resins such as polybutylene terephthalate, polyethylene terephthalate, polyethylene naphthalate, polybutylene naphthalate, polystyrene, polycarbonate, polysulfone, polyethersulfone, polyallylate, allyl diglycol carbonate, polyamide, polyimide, polyamide-imide, polyetherimide, polybenzoazole, polyphenylene sulfide, polycycloolefin, norbornene resins, polychlorotrifluoroethylene and the like, synthetic resins such as liquid crystal polymers, acrylic resins, epoxy resins, silicone resins, ionomer resins, cyanate resins, cross-linked fumaric acid diester, cyclic polyolefins, aromatic ethers, maleimide-olefin, cellulose, episulfide compounds and the like, substrates formed from compound plastic materials of the previously-listed synthetic resins or the like and silicon oxide particles, substrates formed from compound plastic materials of the previously-listed synthetic resins or the like and metal nanoparticles, inorganic oxide nanoparticles, or inorganic nitride nanoparticles or the like, substrates formed from compound plastic materials of the previously-listed synthetic resins or the like and carbon fibers or carbon nanotubes, substrates formed from compound plastic materials of the previously-listed synthetic resins or the like and glass flake, glass fibers or glass beads, substrates formed from compound plastic materials of the previously-listed synthetic resins or the like and clay minerals or particles having a mica crystal structure, laminated plastic substrates having a junction interface of at least one time between thin glass and any of the previously-listed synthetic resins, substrates formed from a composite material having a barrier performance and having a junction interface of at least one or more times due to inorganic layers and organic layers (the previously-listed synthetic resins) being layered alternately, a stainless steel substrate or a metal multi-layer substrate in which stainless steel and a different type of metal are laminated, an aluminum substrate or an aluminum substrate with an oxide surface film having an improved insulating ability of the surface due to the surface being subjected to an oxidizing treatment (e.g., an anodic oxidation treatment), and the like can be used.

Note that the fact that resin substrates have excellent heat-resistance, dimensional stability, solvent resistance, electrical insulating ability, workability, low permeability, low moisture absorbing ability, and the like, is preferable. The resin substrate may have a gas barrier layer for preventing passage of moisture and oxygen, or an undercoat layer for improving the flatness of the resin substrate and the adhesiveness with the lower electrodes, or the like.

Further, it is preferable that the thickness of the substrate is greater than or equal to 50 μm and less than or equal to 500 μm. When the thickness of the substrate is greater than or equal to 50 μm, the flatness of the substrate itself improves more. When the thickness of the substrate is less than or equal to 500 μm, the flexibility of the substrate itself improves more, and usage as a substrate for a flexible device is even easier. Note that the thickness that has sufficient flatness and flexibility differs in accordance with the material that structures the substrate 12, and therefore, the thickness thereof must be set in accordance with the substrate material. However, in general, the range thereof is the range of greater than or equal to 50 μm and less than or equal to 500 μm.

—Active Layer—

The active layer 14 contains, as the main component thereof, an oxide semiconductor that is structured by O and at least two types of elements among In, Ga and Zn. Note that "main component" means that, among the structural components that structure the active layer 14, the component that is contained in the greatest amount.

Further, the active layer (mainly an oxide semiconductor) may be either of amorphous or crystalline, but is preferably amorphous. Whether the active layer is crystalline or amorphous can be confirmed by X-ray diffraction measurement. Namely, if clear peaks expressing a crystalline structure are not detected from X-ray diffraction measurement, it can be judged that this active layer is amorphous. If the active layer is amorphous, film formation is possible at low temperatures of less than 300° C., and therefore, the active layer is easily formed on a resin substrate that is flexible, such as a plastic substrate. Accordingly, application to flexible displays that use plastic substrates with TFTs is even easier. Moreover, with an amorphous film, it is easy to form a film that is uniform over a large surface area, and grain boundaries such as those of a polycrystalline material do not exist, and therefore, it is easy to suppress dispersion in the element characteristics.

Further, the active layer 14 may have a composition distribution in the layer thickness direction or in the surface direction that is orthogonal to the layer thickness direction, and similarly, may have an oxygen concentration distribution in the layer thickness direction or in the surface direction that is orthogonal to the layer thickness direction.

It suffices for the resistivity of the active layer 14 to be a resistivity that is such that the active layer 14 behaves as a semiconductor generally, and, in particular, from the standpoint of making the active layer 14 be an active region, it is preferable that the resistivity at room temperature (20° C.) be greater than or equal to 1 Ωcm and less than or equal to $1\times10^6$ Ωcm. Note that the resistivity in the present embodiment is a value measured by ResiTest8310 (manufactured by TOYO Corporation).

The film thickness (total film thickness) of the active layer 14 is not particularly limited, but, greater than or equal to 10 nm and less than or equal to 200 nm is preferable.

Note that, in a TFT that is used for organic EL driving, the blue color light emission layer that is used in organic EL exhibits broad light emission having a peak at around λ=450 nm. Therefore, in a case in which the optical band gap of the IGZO film were to be relatively narrow and the IGZO film would have optical absorption in that region, the problem of a threshold value shift of the transistor occurring would arise. Accordingly, for TFTs that are used for organic EL driving in particular, it is preferable that the band gap of the material used at the active layer 14 be large with respect to 3.0 eV.

It is preferable that the number of $H_2O$ molecules, observed by thermal desorption spectrometry, of the active layer 14 is less than or equal to $4.2\times10^{20}$ cm$^{-3}$. Note that the "number of $H_2O$ molecules observed by thermal desorption spectrometry" expresses a number of molecules of M/z=18 observed to be desorbed when the sample stage temperature is raised to 800° C. The active layer 14, at which the number of $H_2O$ molecules observed by thermal desorption spectrometry is less than or equal to $4.2\times10^{20}$ cm$^{-3}$, is an oxide semiconductor thin film from which moisture, that induces excess carriers contained within the film, is removed, and exhibits good semiconductor characteristics.

—Source/Drain Electrodes—

The source electrode 16 and the drain electrode 18 are not particularly limited provided that they both are materials having high electrical conductivity (e.g., materials having electrical conductivity higher than that of the active layer 14). For example, a metal oxide electrically conductive film of a metal such as Al, Mo, Cr, Ta, Ti, Au, Ag or the like, or Al—Nd, tin oxide, zinc oxide, indium oxide, indium tin oxide (ITO), indium zinc oxide (IZO) or the like, or the like can be used as a single layer or as a layered structure of two or more layers.

When the source electrode 16 and the drain electrode 18 are structured from the aforementioned metals, in consideration of film formability, and the ability to be patterned by etching or a lift-off method, and the electrical conductivity and the like, the thickness thereof is preferably made to be greater than or equal to 10 nm and less than or equal to 1000 nm, and more preferably made to be greater than or equal to 50 nm and less than or equal to 100 nm.

—Gate Insulating Film—

The gate insulating film 20 is preferably a film having a high insulating ability, and can be structured from an insulating film of, for example, $SiO_2$, $SiN_x$, SiON, $Al_2O_3$, $Y_2O_3$, $Ta_2O_5$, $HfO_2$ or the like, or from an insulating film that contains at least two or more of these compounds, or the like.

Note that the gate insulating film 20 must have a thickness that is sufficient in order to decrease the leak current and improve the voltage tolerance, but on the other hand, if the thickness of the gate insulating film is too large, it leads to a rise in the driving voltage. Although it depends on the material of the gate insulating film as well, the thickness of the gate insulating film 20 is preferably greater than or equal to 10 nm and less than or equal to 10 μm, and more preferably greater than or equal to 50 nm and less than or equal to 1000 nm, and particularly preferably greater than or equal to 100 nm and less than or equal to 400 nm.

—Gate Electrode—

The gate electrode 22 is not particularly limited provided that it is a material having high electrical conductivity. For example, a metal oxide electrically conductive film of a metal such as Al, Mo, Cr, Ta, Ti, Au, Ag or the like, or Al—Nd, tin oxide, zinc oxide, indium oxide, indium tin oxide (ITO), indium zinc oxide (IZO) or the like, or the like can be used as a single layer or as a layered structure of two or more layers.

When the gate electrode 22 is structured from the above-described metals, in consideration of film formability, and the ability to be patterned by etching or a lift-off method, and the electrical conductivity and the like, the thickness thereof is preferably made to be greater than or equal to 10 nm and less than or equal to 1000 nm, and more preferably made to be greater than or equal to 50 nm and less than or equal to 200 nm.

<Thin-Film Transistor: Method of Fabricating TFT>

A method of fabricating a TFT relating to an embodiment of the present invention is described next. Note that a case of fabricating the TFT 10, that has a top gate structure and is a top contacting type and is shown in FIG. 1A, is described concretely as a representative example, but the present invention can similarly be applied also to cases of fabricating TFTs of other forms.

The method of fabricating a TFT relating to the embodiment of the present invention is a method of fabricating a thin-film transistor, comprising a film-forming step of film-forming the active layer 14, that contains as the main component thereof an oxide semiconductor structured by O and at least two elements among In, Ga and Zn, in a film formation chamber into which at least oxygen is introduced, and a heat treatment step of subjecting the active layer 14 to a heat treatment at less than 300° C. in a dry atmosphere, wherein the film-forming step and the heat treatment step are carried out such that, given that an oxygen partial pressure with respect to the entire pressure of the atmosphere within the film formation chamber in the film-forming step is $PO_2depo$ (%), and an oxygen partial pressure with respect to the entire pressure of the atmosphere during the heat treatment step is $PO_2anneal$ (%), the oxygen partial pressure $PO_2anneal$ (%) at the time of the heat treatment step satisfies the relationship $-20/3PO_2depo+40/3 \le PO_2anneal \le -800/43PO_2depo+5900/43$.

More concrete description is given hereinafter.

—Film-Forming Step—

First, the substrate 12, that is formed from any one of the above-described materials, is readied, and this substrate 12 is placed in a film formation chamber. Then, after at least oxygen is introduced into the film formation chamber, a film-forming step is carried out in which the active layer 14, that has, as the main component thereof, an oxide semiconductor structured by O and at least two elements among In, Ga, Zn, is film-formed on one main surface of the substrate 12 within this film formation chamber.

The oxide semiconductor of the active layer 14 is preferably structured of In, Ga, Zn and O (IGZO). In the case of this structure, the mol ratio of Ga with respect to the total of the mol ratio of In and the mol ratio of Ga preferably satisfies the relationship $0.375 \le Ga/(In+Ga) \le 0.9$. If within the aforementioned compositional range, a normally-off TFT is reliably obtained. Further, it is more preferable that the mol ratio of Ga with respect to the total of the mol ratio of In and the mol ratio of Ga is $0.375 \le Ga/(In+Ga) \le 0.625$. If within the aforementioned compositional range, in a case in which the heat treatment step is carried out, a TFT that exhibits a good field effect mobility of, for example, greater than or equal to 10 cm²/Vs is obtained.

Moreover, a deeper well-type potential structure can also be obtained by doping a portion of the Zn of the oxide semiconductor with element ions that broaden the band gap. Concretely, the band gap of the film can be enlarged by doping with Mg.

The film-forming method of the active layer 14 is not particularly limited provided that it is a method that is carried out within a vacuum film formation chamber at which the amount of introduced oxygen can be adjusted, such as, for example, physical methods such as a vacuum deposition method, a sputtering method, an ion plating method or the like, or chemical methods such as CVD, a plasma CVD method, or the like, or the like. However, formation by a sputtering method is preferably because the surface area can be made to be large and the film-forming rate also is high.

The carrier concentration of the active layer 14 is controlled arbitrarily by control of the oxygen deficiency amount or by cation doping. When it is desired to increase the carrier concentration, it suffices to increase the oxygen deficiency amount or to dope with a material (e.g., Ti, Zr, Hf, Ta or the like) that easily becomes cations having a relatively large valence. However, when doping with cations having a large valence, the number of structural elements of the oxide semiconductor film increases, and this is therefore disadvantageous in terms of simplifying the film-forming process and lowering costs. Therefore, it is preferable to control the carrier concentration by the oxygen concentration (oxygen deficiency amount).

Thus, the oxygen partial pressure $PO_2depo$ (%) within the film formation chamber during the film-forming step is adjusted appropriately such that the aforementioned oxygen partial pressure $PO_2anneal$ (%) at the time of the heat treatment step satisfies the relationship $-20/3PO_2depo+40/3 \le PO_2anneal \le -800/43PO_2depo+5900/43$. By adjusting to this range, the carrier concentration is controlled, and a normally-off TFT having a high field effect mobility can be realized.

Here, generally, in an oxide semiconductor, in order to increase the carrier concentration, the oxygen partial pressure $PO_2depo$ is lowered and the oxygen deficiency amount is increased, and in particular, in IGZO, behavior that is such that the carrier concentration increases and the mobility increases has been reported. However, excess oxygen deficiency simultaneously results in carriers becoming scattered bodies, and conversely becomes a cause of lowering the mobility. Accordingly, it is preferable to adjust the oxygen partial pressure $PO_2depo$ to greater than or equal to 0.17%.

Further, it is preferable to adjust the oxygen partial pressure $PO_2depo$ to greater than or equal to 0.50%. When the oxygen partial pressure is greater than or equal to 0.50%, it is easy to obtain a normally-off TFT that has little scattering of the carriers due to excess oxygen deficiency such as described above, and that has high mobility.

More desirably, it is good for the oxygen partial pressure $PO_2depo$ to be less than or equal to 6.3%. This is because, when the oxygen partial pressure $PO_2depo$ exceeds 6.3%, there becomes a state in which the oxygen vacancy concentration in the active layer before the heat treatment is relatively low, and, although the TFT is a normally-off TFT, a decrease in mobility is easily brought about due to the decrease in the carrier concentration.

The environment during the film formation is not particularly limited provided that it contains oxygen. The environment may, in addition, contain argon or nitrogen for example.

The film formation temperature of the active layer 14 is preferably a low temperature of less than 300° C. from the standpoint of improving the selectivity of the substrate 12, and is more preferably less than or equal to 200° C. for example from the standpoint of making the active layer 14 be amorphous, and is even more preferably ordinary temperature (25° C.) from the standpoint of saving on cost and time.

After the active layer 14 is film-formed, patterning of the active layer 14 is carried out appropriately. The patterning can be carried out by photolithography and etching. Concretely, a pattern is formed by forming a resist pattern by photolithography at the portions that are to remain, and by etching by an acid solution of hydrochloric acid, nitric acid, dilute sulfuric acid, or a mixed liquid of phosphoric acid, nitric acid and acetic acid, or the like.

Note that, during the film formation of the active layer 14 and/or after the film formation of the active layer 14, there may be included a step of irradiating oxygen-containing radicals onto the film formation surface of the active layer 14 and controlling the oxygen vacancy concentration within the active layer 14.

Further, during the film formation of the active layer 14 and/or after the film formation of the active layer 14, there may be included a step of irradiating ultraviolet rays onto the film formation surface of the active layer 14 in an ozone atmosphere and controlling the oxygen vacancy concentration within the active layer 14.

—Heat Treatment Step—

After film formation of the active layer 14, a heat treatment step that carries out a heat treatment at less than 300° C. on the active layer 14 in a dry atmosphere is carried out. However, "after film formation of the active layer 14" means after any step provided that it is after the active layer 14 film-forming step. For example, the heat treatment step may be directly after the active layer 14 film-forming step, or may be after an electrode forming step that is described later, or may be after the TFT array is completed.

The reason why the atmosphere is made to be a dry atmosphere is in order to realize a normally-off TFT. Note that a dry atmosphere means an atmosphere that hardly contains any moisture and in which the moisture content contained in the entire atmosphere is less than or equal to −36° C. when converted into dew point temperature (an absolute humidity of less than or equal to 0.21 g/m$^{-3}$).

The reason why the temperature is made to be less than 300° C. is in order to broaden the selectivity of the substrate.

Further, in the heat treatment step, as described above, the oxygen partial pressure $PO_2$anneal (%) at the time of the heat treatment step is adjusted so as to satisfy the relationship $-20/3PO_2\text{depo}+40/3 \leq PO_2\text{anneal} \leq -800/43PO_2\text{depo}+5900/43$. By adjusting to this range, a normally-off TFT having a high field effect mobility can be realized.

The heat treatment temperature at the time of the heat treatment step is preferably made to exceed 150° C. from the standpoint of reliably obtaining a normally-off TFT. Moreover, the heat treatment temperature is preferably made to be less than or equal to 250° C. from the standpoint of increasing the mobility. Still further, the heat treatment temperature is preferably made to be less than or equal to 200° C. By making the heat treatment temperature be in the low-temperature region of less than or equal to 200° C., the selectivity of the substrate 12 to which the above-described heat treatment can be applied is greatly increased, and the heat treatment is easily applied even to TFTs that are formed on a flexible substrate of plastic or the like, and the like.

Note that, provided that it contains oxygen, the atmosphere at the time of the heat treatment may additionally contain argon or nitrogen.

—Other Points—

After the active layer 14 film-forming step, or after the heat treatment step, an electrically conductive film for forming the source/drain electrodes 16, 18 is formed on the active layer 14. Next, the electrically conductive film is patterned into a predetermined shape by etching or a lift-off method, and the source electrode 16 and the drain electrode 18 are formed. At this time, it is preferable that the source/drain electrodes 16, 18 and unillustrated wires that are connected to these electrodes be patterned simultaneously.

In the film formation of the electrically conductive films of both the source electrode 16 and the drain electrode 18, it suffices for the film to be formed in accordance with a method that is selected appropriately in consideration of the suitability with the material that is used, from among, for example, wet methods such as a printing method, a coating method or the like, physical methods such as a vacuum deposition method, a sputtering method, an ion plating method or the like, chemical methods such as CVD, a plasma CVD method or the like, and the like.

After the source/drain electrodes 16, 18 and the wires are formed, the gate insulating film 20 is formed. The gate insulating film 20 is patterned and formed into a predetermined shape by photolithography and etching.

In the film formation of the gate insulating film 20, similarly, it suffices for the film to be formed in accordance with a method that is selected appropriately in consideration of the suitability with the material that is used, from among, for example, wet methods such as a printing method, a coating method or the like, physical methods such as a vacuum deposition method, a sputtering method, an ion plating method or the like, chemical methods such as CVD, a plasma CVD method or the like, and the like.

After the gate insulating film 20 is formed, the gate electrode 22 is formed. An electrode film is film-formed, and thereafter, is patterned into a predetermined shape by etching or a lift-off method, and the gate electrode 22 is formed. At this time, it is preferable that the gate electrode 22 and the gate wires be patterned simultaneously.

In the film formation of the gate electrode 22 as well, similarly, it suffices for the film to be formed in accordance with a method that is selected appropriately in consideration of the suitability with the material that is used, from among, for example, wet methods such as a printing method, a coating method or the like, physical methods such as a vacuum deposition method, a sputtering method, an ion plating method or the like, chemical methods such as CVD, a plasma CVD method or the like, and the like.

The TFT 10 shown in FIG. 1A can be fabricated by the above-described processes. For the TFT relating to the embodiment of the present invention, a TFT whose field effect mobility exceeds 10 cm$^2$/Vs and that exhibits a normally-off characteristic is obtained.

<Application>

There are no limitations in particular on the application of the TFT of the present embodiment that is described above, but the TFT is suitable as a driving element in, for example, electro-optical devices (e.g., display devices such as liquid crystal display devices, organic EL (Electro Luminescence) display devices, inorganic EL display devices and the like, or the like), and particularly in cases of being used in a large-surface-area device.

Moreover, the TFT of the embodiment is particularly suited to devices that can be fabricated by low-temperature processes using a resin substrate (e.g., flexible displays or the like), and is suitably used as a driving element (a driving circuit) in various types of electronic devices such as various types of sensors such as X-ray sensors or the like, or MEMS (Micro Electro Mechanical Systems), or the like.

<Electro-Optical Device and Sensor>

An electro-optical device or sensor of the present embodiment is structured to have the above-described thin-film transistor of the present invention.

Examples of the electro-optical device are display devices (e.g., liquid crystal display devices, organic EL display devices, inorganic EL display devices, and the like).

Image sensors such as CCDs (Charge Coupled Devices) or CMOSs (Complementary Metal Oxide Semiconductors) and the like, and X-ray sensors and the like are suitable as examples of the sensor.

Electro-optical devices and sensors that use the TFT of the present embodiment both have good in-plane uniformity of the characteristic. Note that what is called characteristic here means the display characteristic in the case of an electro-optical device (display device) and the sensitivity characteristic in the case of a sensor.

Hereinafter, a liquid crystal display device, an organic EL display device, and an X-ray sensor are described as representative examples of the electro-optical device or sensor that has the thin-film transistor that is fabricated by the present embodiment.

<Liquid Crystal Display Device>

Figure 2:
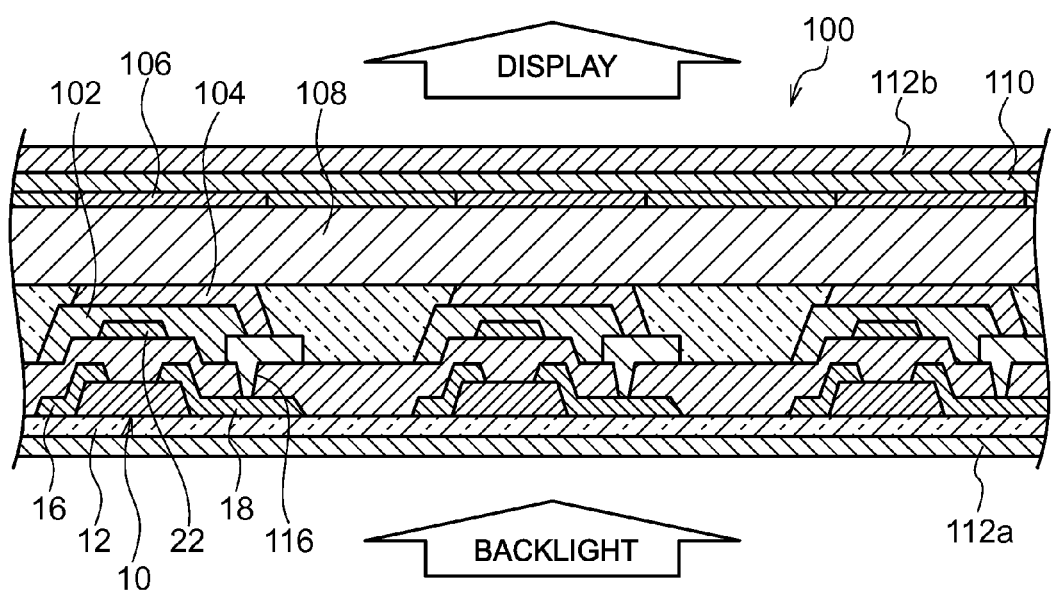
FIG. 2 is a schematic sectional view showing a portion of a liquid crystal display device of an embodiment.
Figure 3:
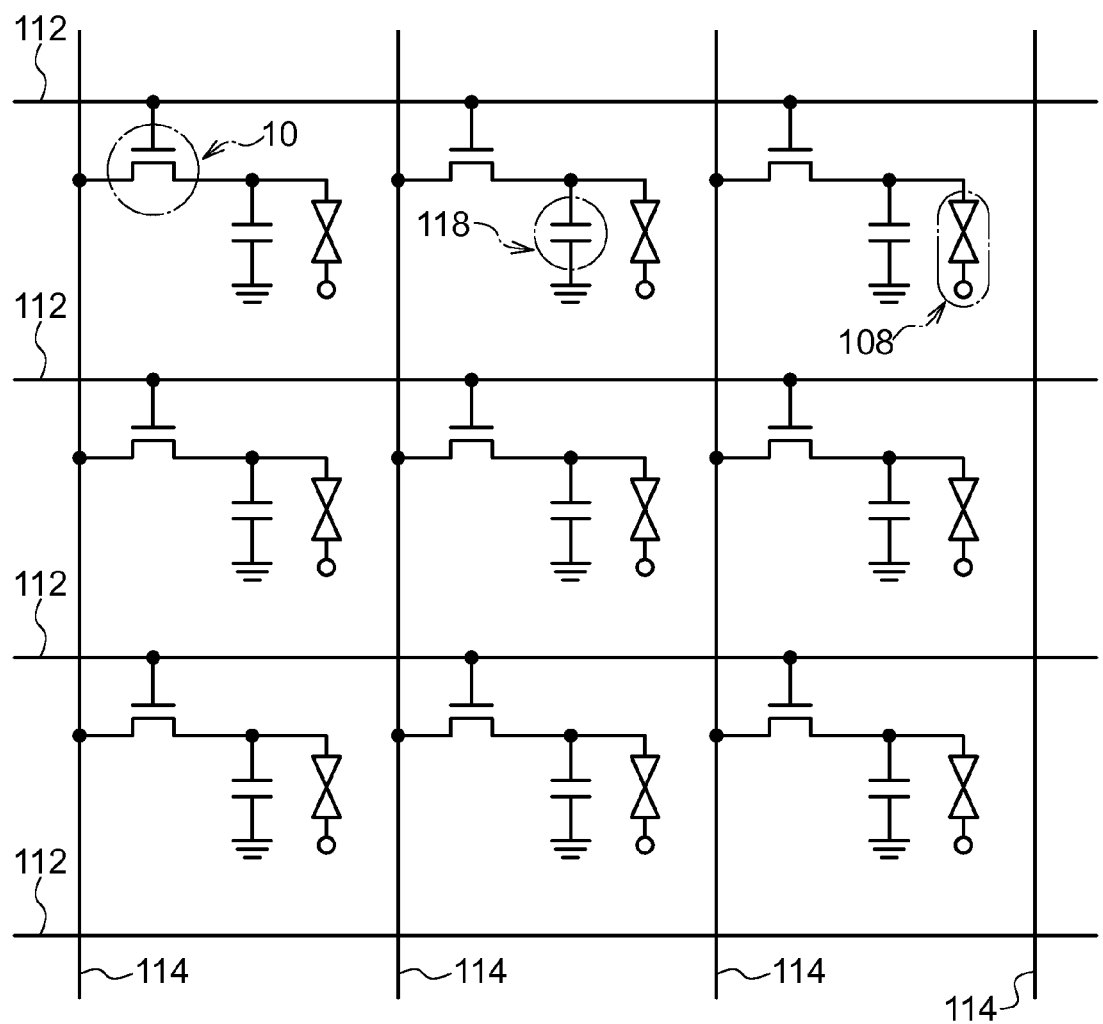
FIG. 3 is a schematic structural drawing of the electrical wiring of the liquid crystal display device of FIG. 2.

A schematic sectional view of a portion of a liquid crystal display device that is an embodiment of the electro-optical device of the present invention is shown in FIG. 2, and a schematic structural drawing of the electrical wiring thereof is shown in FIG. 3.

As shown in FIG. 2, a liquid crystal display device 100 of the present embodiment has the TFT 10 that has a top gate structure and is a top contacting type and is shown in FIG. 1A, a liquid crystal layer 108 that is nipped between a pixel lower electrode 104 and an opposing upper electrode 106 thereof on the gate electrode 22 that is protected by a passivation layer 102 of the TFT 10, and an RGB color filter 110 that is for generating different colors in accordance with the respective pixels, and is structured so as to have polarization plates 112a, 112b on the substrate 12 side of the TFT 10 and on the RGB color filter 110, respectively.

Further, as shown in FIG. 3, the liquid crystal display device 100 of the present embodiment has plural gate lines 112 that are parallel to one another, and data lines 114 that are parallel to one another and intersect the gate lines 112. Here, the gate lines 112 and the data lines 114 are electrically insulated. The TFTs 10 are provided in vicinities of the intersecting portions of the gate lines 112 and the data lines 114.

The gate electrode 22 of the TFT 10 is connected to the gate line 112, and the source electrode 16 of the TFT 10 is connected to the data line 114. Further, the drain electrode 18 of the TFT 10 is connected to the pixel lower electrode 104 via a contact hole 116 (an electric conductor is embedded in the contact hole 116) that is provided in the gate insulating film 20. This pixel lower electrode 104, together with the opposing upper electrode 106 that is grounded, structures a capacitor 118.

The liquid crystal device of the present embodiment shown in FIG. 2 has the TFT 10 that has a top gate structure. However, the TFT that is used in the liquid crystal device that is the display device of the present invention is not limited to a top gate structure, and may be a TFT having a bottom gate structure.

The TFT 10 relating to the embodiment of the present invention has high mobility, and therefore, high quality display such as high definition, high-speed response, high contrast, and the like is possible at the liquid crystal display device 100, and the TFT 10 is also suited to enlarging the screen size. Further, when the IGZO of the active layer is amorphous, dispersion in the element characteristics can be suppressed, and excellent display quality without non-uniformity in a large screen is realized. Moreover, because there is little characteristic shift, the gate voltage can be reduced, and accordingly, the electric power consumed by the display device can be reduced. Further, in accordance with the present invention, the thin-film transistor can be fabricated by using, as the active layer 14, an amorphous IGZO film that can be film-formed at a low temperature (e.g., less than or equal to 300° C.), and therefore, a resin substrate (plastic substrate) can be used as the substrate 12. Accordingly, a liquid crystal display device, that is flexible and has excellent display quality, can be provided.

<Organic EL Display Device>

Figure 4:
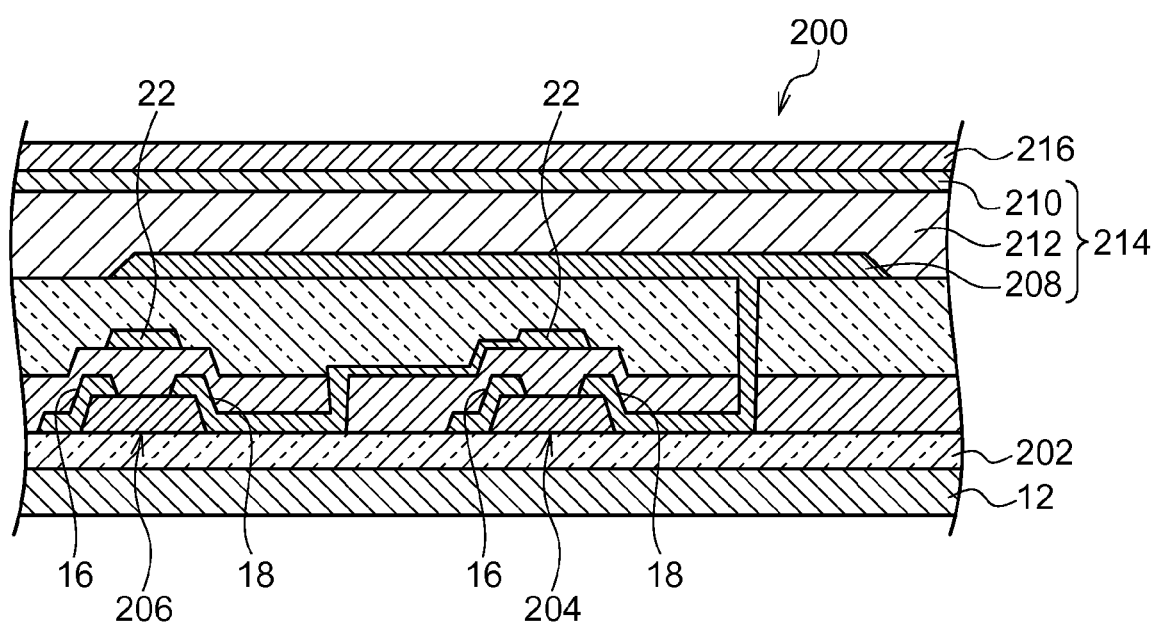
FIG. 4 is a schematic sectional view showing a portion of an organic EL display device of an embodiment.
Figure 5:
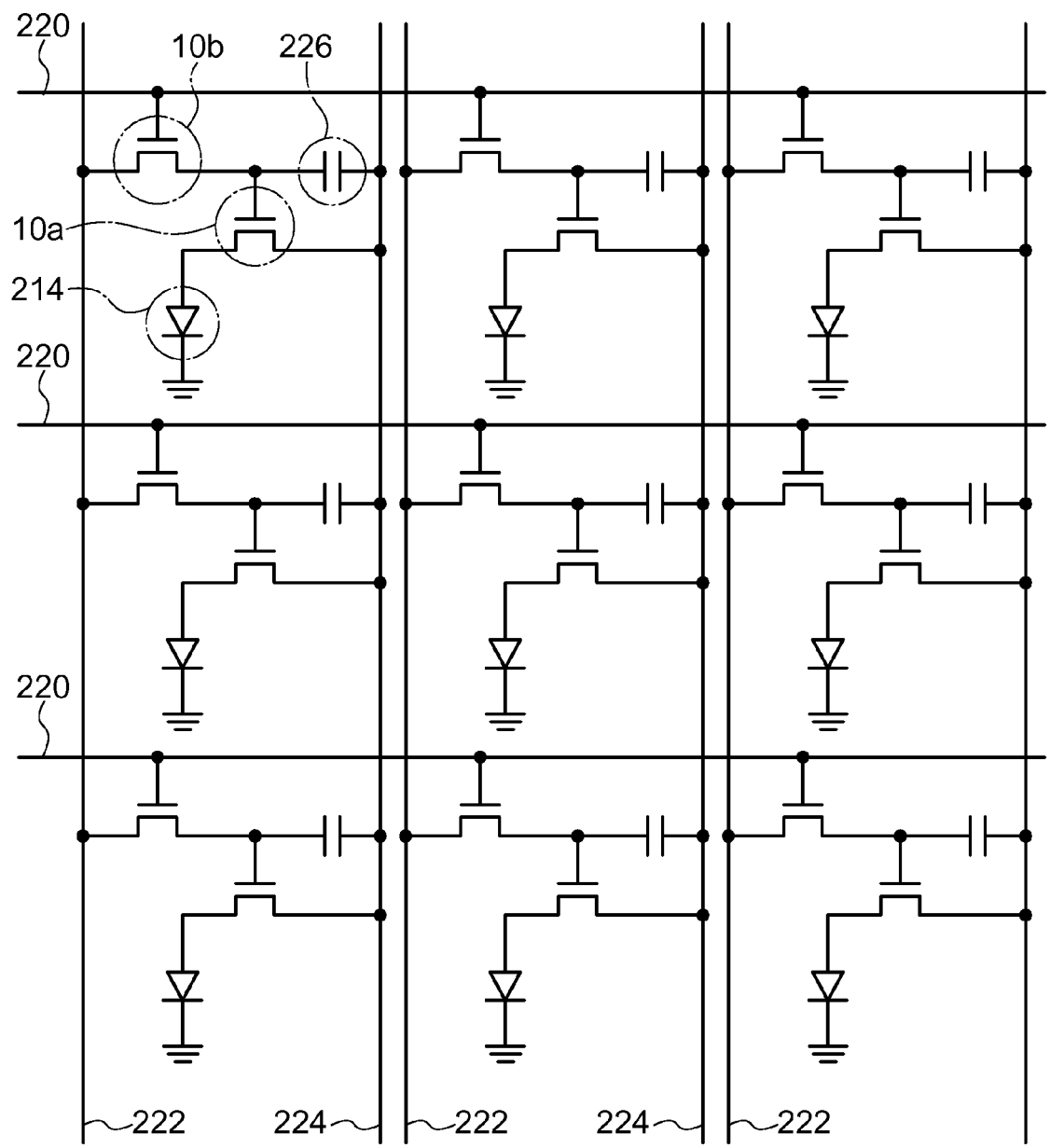
FIG. 5 is a schematic structural drawing of the electrical wiring of the organic EL display device of FIG. 4.

A schematic sectional view of a portion of an active-matrix organic EL display device that is an embodiment of the electro-optical device of the present invention is shown in FIG. 4, and a schematic structural drawing of the electrical wiring thereof is shown in FIG. 5.

There are two types of methods for driving an organic EL display device, which are a simple matrix method and an active matrix method. The simple matrix method has the merit that the display device can be manufactured at a low cost, but, because the pixels are made to emit light by selecting the scan lines one-by-one, the number of scan lines and the light-emitting time per scan line are inversely proportional. Therefore, it becomes difficult to increase the definition of the display device and make the display device have a large screen. In the active matrix method, because the transistors and capacitors are formed per pixel, the manufacturing cost is high, but the active matrix method does not have the problem of not being able to increase the number of scan lines as in the simple matrix method, and therefore, is suited to making the display device have higher definition and have a large screen.

An active-matrix organic EL display device 200 of the present embodiment is structured such that the TFT 10, that has a top gate structure and is shown in FIG. 1A, is provided as a TFT 204 for driving and a TFT 206 for switching on the substrate 12 that has a passivation layer 202, and so as to have, above these TFTs 204 and 206, an organic EL light-emitting element 214 that is formed from an organic light-emission layer 212 that is sandwiched between a lower electrode 208 and an upper electrode 210, and such that the upper surface as well is protected by a passivation layer 216.

Further, as shown in FIG. 5, the organic EL display device 200 of the present embodiment has plural gate lines 220 that are parallel to one another, and data lines 222 and driving lines 224 that are parallel to one another and that intersect the gate lines 220. Here, the gate lines 220, and the data lines 222 and driving lines 224, are electrically insulated. The gate electrode 22 of a TFT 10b for switching is connected to the gate line 220, and the source electrode 16 of the TFT 10b for switching is connected to the data line 222. Further, the drain electrode 18 of the TFT 10b for switching is connected to the gate electrode 22 of the TFT 10 for driving, and, by using a capacitor 226, a TFT 10a for driving is maintained in an on state. The source electrode 16 of the TFT 10a for driving is connected to the driving line 224, and the drain electrode 18 is connected to the organic EL light-emitting element 214.

The organic EL device of the present embodiment that is shown in FIG. 4 is provided with the TFTs 10a and 10b that have top gate structures. However, the TFTs that are used in the organic EL device that is a display device of the present invention are not limited to top gate structures, and may be TFTs having bottom gate structures.

The TFT 10 relating to the embodiment of the present invention has high mobility, and therefore, display of a high quality and at a low amount of consumed electric power is possible. Further, in accordance with the embodiment of the present invention, the thin-film transistor can be fabricated by using, as the active layer 14, an amorphous IGZO film that can be film-formed at a low temperature (e.g., less than or equal to 300° C.), and therefore, a resin substrate (plastic substrate) can be used as the substrate 12. Accordingly, an organic EL display device, that is flexible and has excellent display quality, can be provided.

Note that the organic EL display device shown in FIG. 4 may be a top-emission-type in which the upper electrode 210 is a transparent electrode, or may be a bottom-emission-type by making the lower electrode 208 and the respective electrodes of the TFTs be transparent electrodes.

<X-Ray Sensor>

Figure 6:
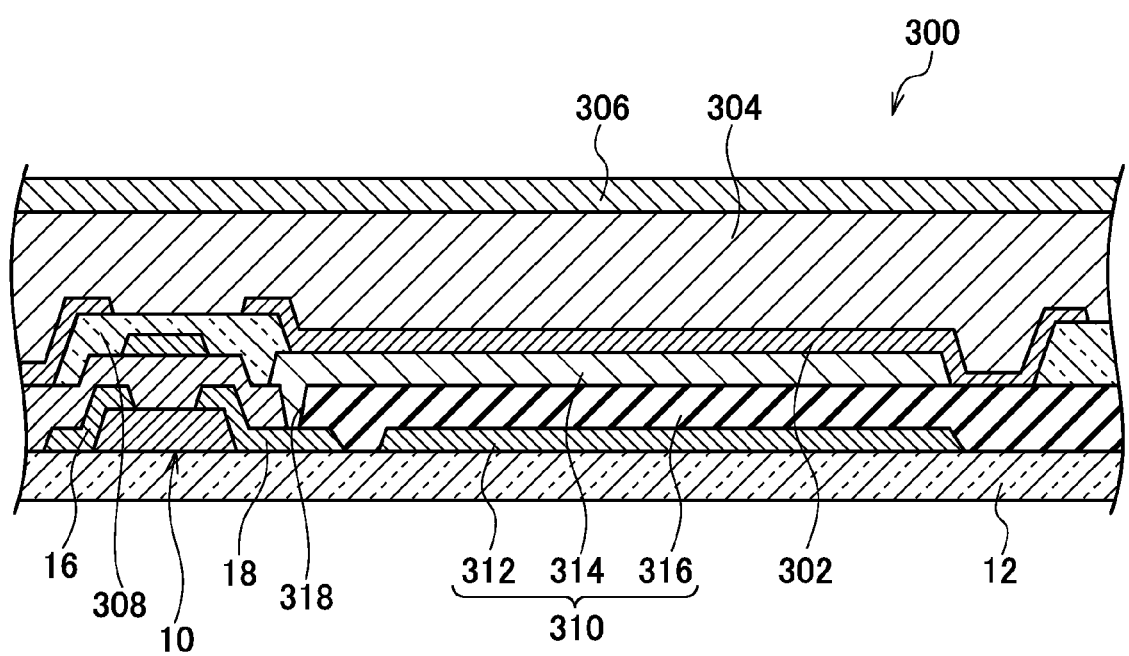
FIG. 6 is a schematic sectional view showing a portion of an X-ray sensor array of an embodiment.
Figure 7:
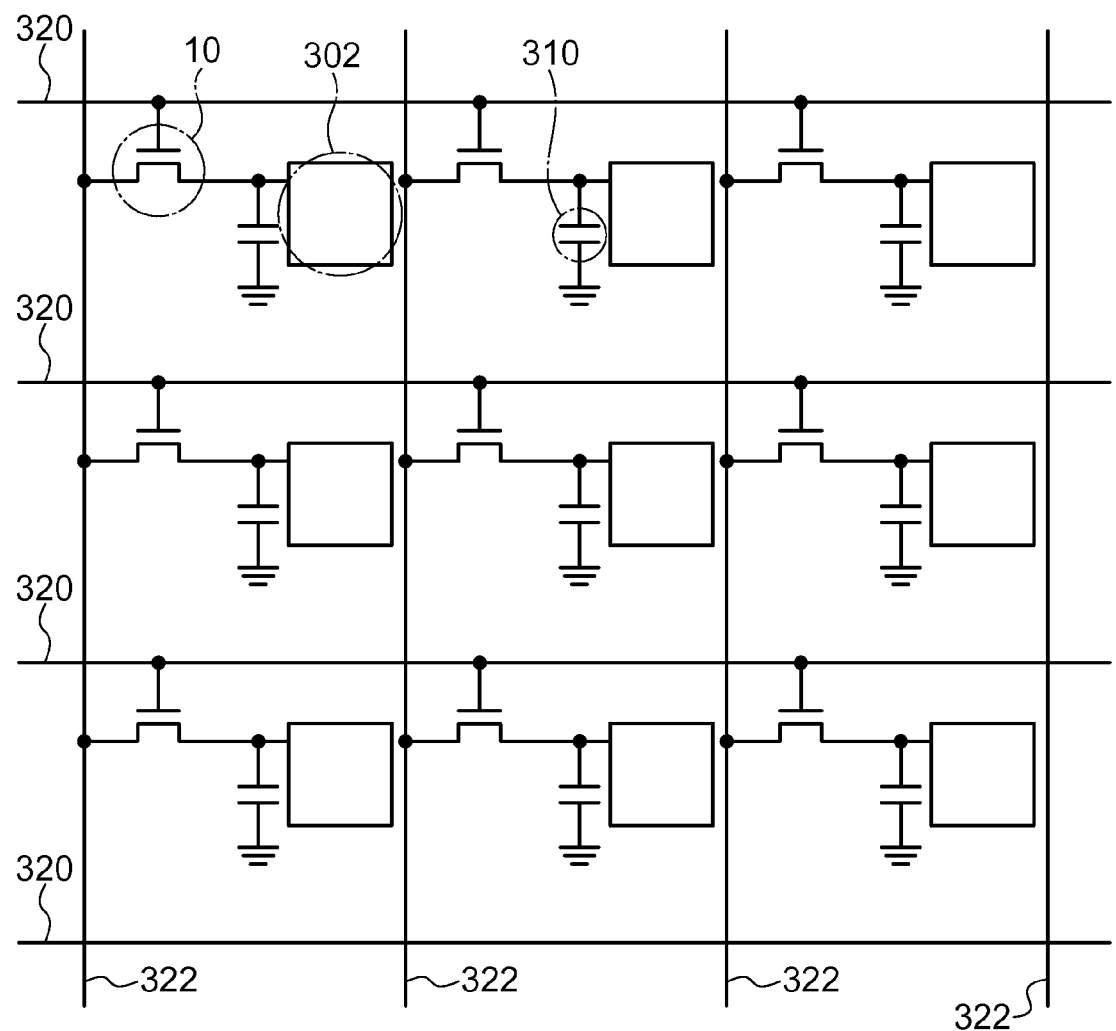
FIG. 7 is a schematic structural drawing of the electrical wiring of the X-ray sensor array of FIG. 6

A schematic sectional view of a portion of an X-ray sensor that is an embodiment of the sensor of the present invention is shown in FIG. 6, and a schematic structural drawing of the electrical wiring thereof is shown in FIG. 7.

FIG. 6 is a schematic sectional view in which a portion of an X-ray sensor array is enlarged more concretely. An X-ray sensor 300 of the present embodiment is structured to have the TFT 10 and a capacitor 310 that are formed on the substrate 12, an electrode 302 for charge collection that is formed on the capacitor 310, an X-ray conversion layer 304, and an upper electrode 306. A passivation film 308 is provided on the TFT 10.

The capacitor 310 is a structure in which an insulating film 316 is sandwiched between a lower electrode 312 for the capacitor and an upper electrode 314 for the capacitor. The upper electrode 314 for the capacitor is connected to either one of the source electrode 16 and the drain electrode 18 of the TFT 10 (in FIG. 6, the drain electrode 18) via a contact hole 318 that is provided in the insulating film 316.

The electrode 302 for charge collection is provided on the upper electrode 314 for the capacitor at the capacitor 310, and contacts the upper electrode 314 for the capacitor. The X-ray conversion layer 304 is a layer that is formed from amorphous selenium, and is provided so as to cover the TFT 10 and the capacitor 310.

The upper electrode 306 is provided on the X-ray conversion layer 304, and contacts the X-ray conversion layer 304.

As shown in FIG. 7, the X-ray sensor 300 of the present embodiment has plural gate lines 320 that are parallel to one another, and plural data lines 322 that are parallel to one another and intersect the gate lines 320. Here, the gate lines 320 and the data lines 322 are electrically insulated. The TFTs 10 are provided in vicinities of the intersecting portions of the gate lines 320 and the data lines 322.

The gate electrode 22 of the TFT 10 is connected to the gate line 320, and the source electrode 16 of the TFT 10 is connected to the data line 322. Further, the drain electrode 18 of the TFT 10 is connected to the electrode 302 for charge collection, and moreover, this electrode 302 for charge collection is connected to the capacitor 310.

In the X-ray sensor 300 of the present embodiment, X-rays are irradiated from the upper portion (the upper electrode 306 side) in FIG. 6, and electron-hole pairs are generated at the X-ray conversion layer 304. By applying a high electric field by the upper electrode 306 to this X-ray conversion layer 304, the generated charges are accumulated at the capacitor 310, and are read-out by the TFTs 10 being scanned successively.

The X-ray sensor 300 relating to the present embodiment of the present invention has the TFT 10, whose on current is high and that has excellent reliability, and therefore, has a high S/N and an excellent sensitivity characteristic. Thus, images of a wide dynamic range are obtained when the X-ray sensor 300 is used in an X-ray digital imaging device. In particular, the X-ray digital imaging device relating to the present embodiment of the present invention is not a device at which only static imaging is possible, and is suited to use as an X-ray digital imaging device at which fluoroscopy by video images and capturing of a static image can be carried out by a single device. Moreover, in cases in which the IGZO of the active layer 14 at the TFT 10 is amorphous, images having excellent uniformity are obtained.

Note that the X-ray sensor of the present embodiment that is shown in FIG. 6 is provided with the TFT that has a top gate structure, but the TFT that is used in the sensor of the present invention is not limited to a top gate structure, and may be a TFT having a bottom gate structure.

EXAMPLES

Experimental Examples are described hereinafter, but the present invention is not limited in any way by these Examples.

The present inventors carried out the following experiments and confirmed that a good semiconductor characteristic is obtained in a specific range of conditions in a heat treatment of less than 300° C., by varying the oxygen partial pressure at the time of active layer film formation, and the atmosphere at the time of the heat treatment carried out after the film-forming step, and the temperature of the heat treatment, in the process of fabricating a thin-film transistor that uses as an active layer containing, as the main component thereof, an oxide semiconductor structured by O and at least two elements among In, Ga and Zn.

—Difference in Moisture Amounts within Film Due to Difference in Heat Treatment Methods after Oxide Semiconductor Thin Film Formation—

Experimental Example 1

As Experimental Example 1, an oxide semiconductor thin film formed from IGZO, that could be applied as an active layer, was formed as a film of 100 nm by a sputtering method on an non-doped Si substrate (manufactured by Mitsubishi Materials Corporation). The sputtering conditions of the oxide semiconductor thin film were as follows.

(Sputtering Conditions of Oxide Semiconductor Thin Film)
  ultimate vacuum; $6 \times 10^{-6}$ Pa
  film formation pressure; $4.4 \times 10^{-1}$ Pa
  film formation temperature; room temperature
  oxygen partial pressure with respect to entire pressure of atmosphere within film formation chamber; 0.50%
  input power ratio of $In_2O_3$, $Ga_2O_3$, ZnO targets; 31.0:61.0:20.0

An oxide semiconductor thin film that, after film formation of the oxide semiconductor thin film, was subjected to a heat treatment of 200° C. with the entire pressure in an oxygen partial pressure controlled furnace being atmospheric pressure and in an atmosphere having a partial pressure ratio of argon and oxygen of $Ar/O_2=80/20$ (oxygen partial pressure $PO_2$anneal=20% with respect to the entirety), was fabricated.

Note that the atmosphere in the above-described heat treatment corresponds to a heat treatment (called dry annealing) in a dry atmosphere in which argon and oxygen are supplied from gas cylinders, and that substantially does not contain water vapor, and in which the moisture content contained in the atmosphere overall is less than or equal to −36° C. when converted into dew point temperature (an absolute humidity of less than or equal to 0.21 $g/m^{-3}$).

Comparative Example 1

As Comparative Example 1, an oxide semiconductor thin film was fabricated by the same method as Experimental Example 1 other than the heat treatment conditions. Concretely, an oxide semiconductor thin film was film-formed by the same method as Experimental Example 1, and thereafter, this oxide semiconductor thin film was subjected to a heat treatment (called wet annealing) of 200° C. in the air of a temperature of 23° C. and a humidity of 66% (the moisture content contained in the entire atmosphere was 16° C. when converted into dew point temperature (an absolute humidity of 13.6 $g/m^{-3}$)).

<Evaluation>

Thermal desorption spectrometry from room temperature to a substrate temperature of 800° C. was carried out on the oxide semiconductor thin films of Experimental Example 1 and Comparative Example 1 by using the thermal desorption spectrometer EMD-WA1000S manufactured by ESCO, Ltd.

Figure 8:
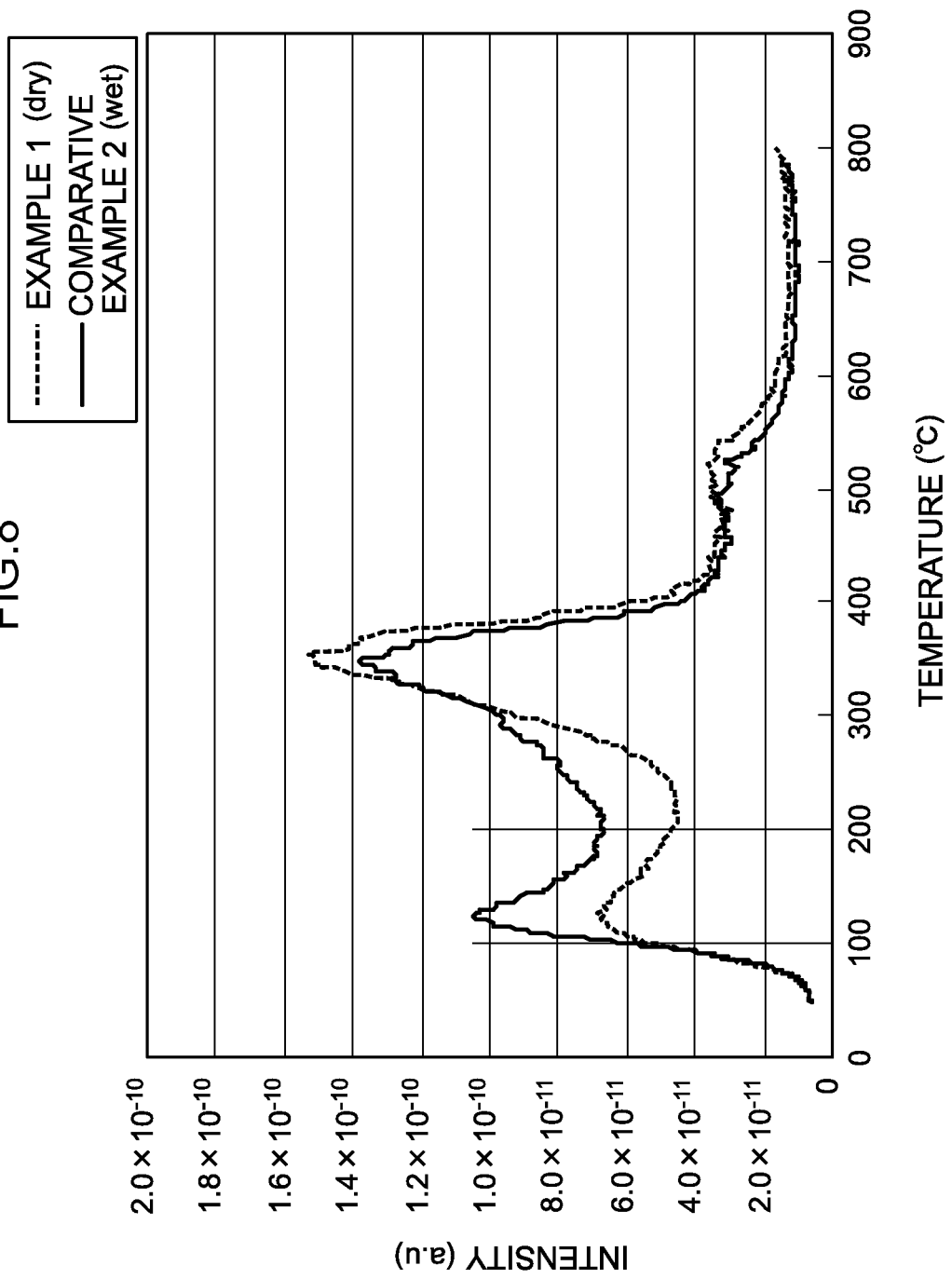
FIG. 8 is a drawing showing, as a graph, analysis results of thermal desorption spectrometry, and is a drawing comparing an intensity peak of m/z=18 that corresponds to $H_2O$ in Experimental Example 1 and Comparative Example 1.

FIG. 8 is a drawing showing the results of analysis of the thermal desorption spectrometry as a graph, and is a drawing that compares Experimental Example 1 and Comparative Example 1 at an intensity peak of m/z=18 corresponding to $H_2O$.

As shown in FIG. 8, it was learned that the intensity peak, that was observed at 100° C. to 200° C. corresponding to the desorption of $H_2O$, of the oxide semiconductor thin film of Experimental Example 1 that was subjected to dry annealing was reduced by around 65% (⅔) as compared with that of Comparative Example 1 that was subjected to wet annealing. Namely, it was learned that the oxide semiconductor thin film of Experimental Example 1 had a lower moisture content within the film.

Thus, the moisture content within the film was computed from the graph shown in FIG. 8 for the oxide semiconductor thin films of Experimental Example 1 and Comparative Example 1. In the computation, the numbers of the number (M/z=18) of $H_2O$ molecules desorbed from the oxide semiconductor thin films of Experimental Example 1 and Comparative Example 1 were detected. The results thereof are shown in Table 2.

TABLE 2

|  | number of $H_2O$ molecules (number cm$^{-3}$) |
|---|---|
| Example 1 | $4.2 \times 10^{20}$ |
| Comparative Example 1 | $4.4 \times 10^{20}$ |

From Table 2, it can be understood that the number of $H_2O$ molecules within the film is greater in Experimental Example 1 than in Comparative Example 1.

Namely, it was learned that a difference in the number of $H_2O$ molecules within the oxide semiconductor thin film arises due to the method of the heat treatment after the oxide semiconductor thin film formation. In particular, in Experimental Example 1 and Comparative Example 1, because there is a difference as to whether or not the heat treatment atmosphere contains moisture, this means that a difference arises in the $H_2O$ molecules, that are contained in the oxide semiconductor film, due to the moisture content that is contained in the annealing atmosphere.

—Variation in TFT Characteristic Due to Difference in Moisture Content within Active Layer Film—

The following experiments were carried out so as to inspect how oxide semiconductor thin films, at which the moisture within the film was different, affected the TFT characteristics when used at the active layer of a TFT.

Experimental Example 2

As Experimental Example 2, a TFT that had a bottom gate structure and was a top contacting type was fabricated as a sample for evaluation.

Figure 9A:
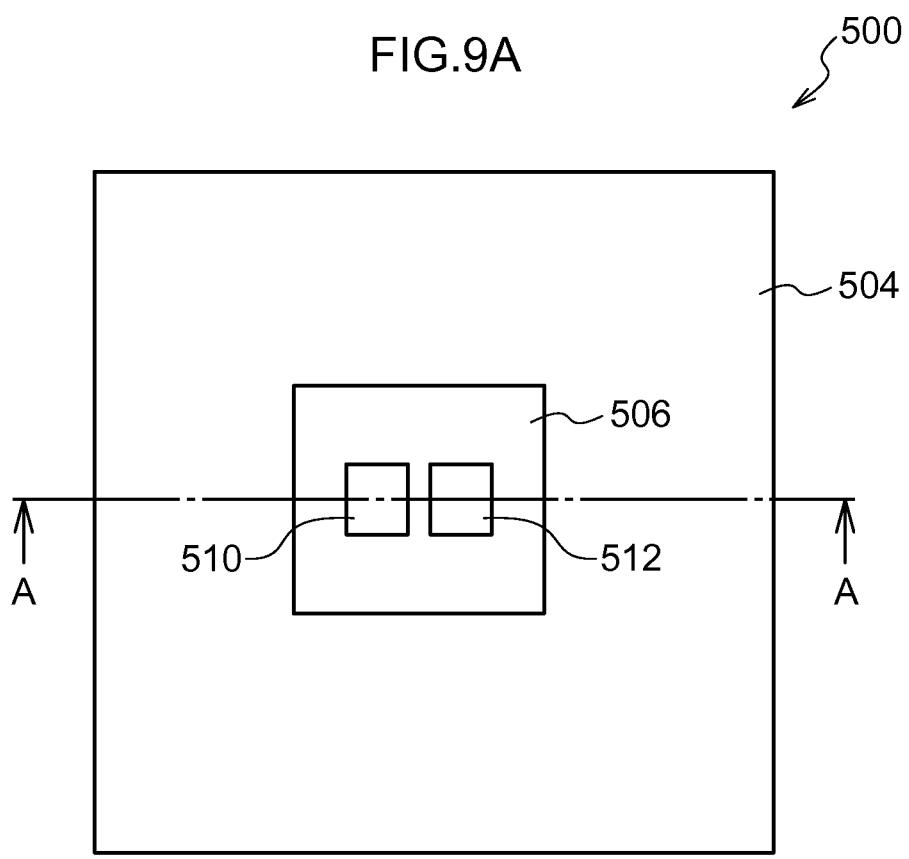
FIG. 9A is a plan view of a TFT of Experimental Example 2.
Figure 9B:
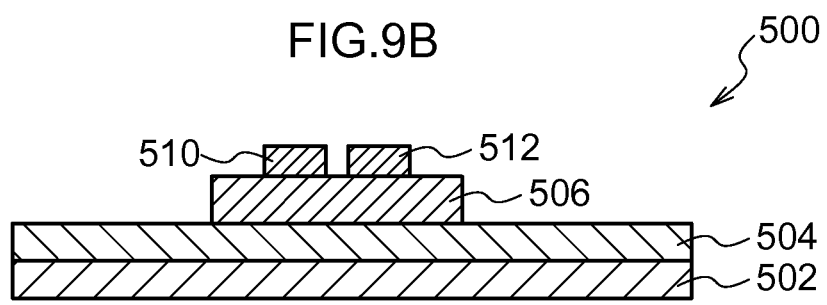
FIG. 9B is a cross-sectional view along the arrow A-A line of the TFT shown in FIG. 9A.

FIG. 9A is a plan view of the TFT of Experimental Example 2, and FIG. 9B is a cross-sectional view along the arrow A-A line of the TFT shown in FIG. 9A.

A TFT 500 of Experimental Example 2 was concretely fabricated as follows.

A p-type silicon substrate (manufactured by Mitsubishi Materials Corporation), that was doped to a high concentration and on whose surface was formed an oxide film 504 of $SiO_2$ and 100 nm, was used as a substrate 502. An IGZO layer of a composition of In:Ga:Zn=1:1:1 was film-formed to 45 nm as an active layer 506 on the substrate 502. The IGZO layer was carried out by a co-sputtering method using an $In_2O_3$ target, a $Ga_2O_3$ target and a ZnO target. The detailed sputtering conditions of the IGZO layer are the same as the conditions of the oxide semiconductor thin film of Experimental Example 1.

After formation of the active layer 506, annealing processing was carried out at 200° C. with the entire pressure in an oxygen partial pressure controlled furnace being atmospheric pressure and in an atmosphere having a partial pressure ratio of argon and oxygen of $Ar/O_2=80/20$ (oxygen partial pressure $PO_2$anneal=20% with respect to the entirety). The argon and oxygen were supplied from gas cylinders, and the heat treatment was carried out in a dry atmosphere. After the heat treatment, Ti/Au electrodes were deposited via a metal mask to thicknesses of 10 nm/40 nm respectively, and source/drain electrodes 510, 512 were formed. Due to the above, the bottom gate type thin-film transistor 500, that related to Experimental Example 2 and had a channel length of 180 μm and a channel width of 1 mm, was obtained. Namely, Experimental Example 2 is a thin-film transistor having, at the active layer, an oxide semiconductor thin film containing $4.2 \times 10^{20}$ cm$^{-3}$ $H_2O$ molecules within the film, which is the same as Experimental Example 1.

Comparative Example 2

A TFT that was fabricated by a method that was entirely the same, other than the heat treatment being carried out in the air (humidity 66%), was prepared as the TFT of Comparative Example 2. Namely, Comparative Example 2 is a TFT having, at the active layer, an oxide semiconductor thin film containing $4.4 \times 10^{20}$ cm$^{-3}$ $H_2O$ molecules within the film, which is the same as Comparative Example 1.

<Evaluation>

Figure 10:
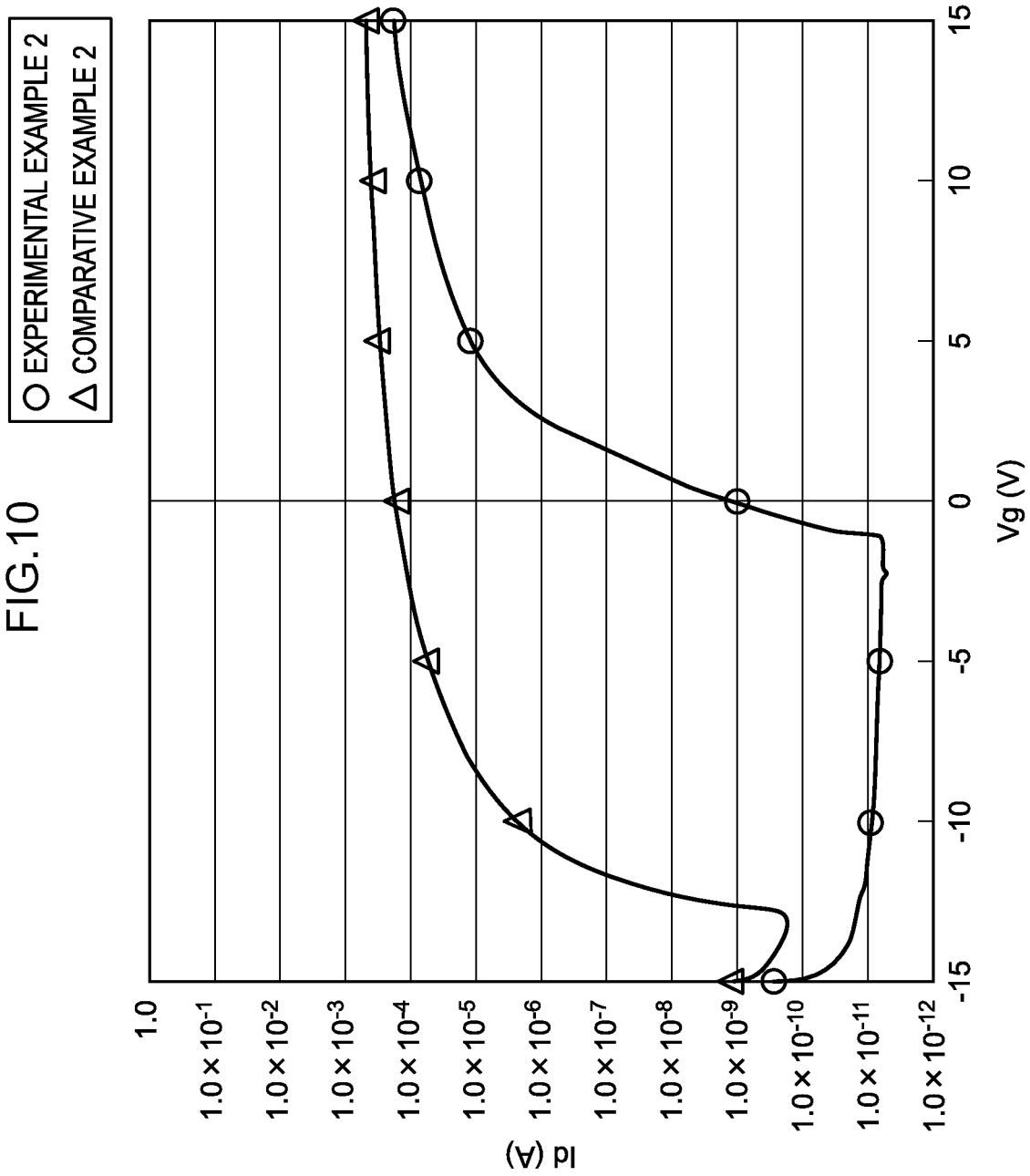
FIG. 10 is a drawing showing the Vg-Id characteristic in Experimental Example 2.

Measurement of the transistor characteristic (Vg-Id characteristic) and field effect mobility μ was carried out on the above-described TFTs of Experimental Example 2 and Comparative Example 2 by using semiconductor parameter analyzer 4156C (manufactured by Agilent Technologies). The results of measurement are shown in FIG. 10. The measurement of the Vg-Id characteristic was carried out by fixing the drain voltage (Vd) at 10 V, and varying the gate voltage (Vg) within the range of −15 V to +15 V, and measuring the drain current (Id) at each gate voltage (Vg). Further, the above-described measurement method was similarly applied also to the Experimental Examples hereinafter.

The threshold voltage (Vth) and field effect mobility of the TFTs of Experimental Example 2 and Comparative Example 2, that were computed from the results of measurement, are shown in Table 3. The threshold voltage (Vth) was computed by measuring the current value Idsat of the saturated region and using the formula $Idsat=WC\mu sat(Vgs-Vth)^2/2L$. Here, W is the channel width of the active layer, L is the channel length of the active layer, C is the electrostatic capacity per unit surface area of the gate insulating film, Vgs is the voltage that is applied between the gate-source electrodes, and μsat is the saturation mobility. Further, the mobility value is expressed by computing the linear mobility from Id that was measured by fixing Vd=1 V and sweeping the gate voltage (Vg) within the range of −15 V to +15 V.

TABLE 3

|  | Vth (V) | mobility (cm²/Vs) |
|---|---|---|
| Example 2 | 1.92 | 14.8 |
| Comparative Example 2 | −10.5 | 19.5 |

FIG. 10 and Table 3 show that both of the TFTs of Experimental Example 2 and Comparative Example 2 exhibit a good switching characteristic whose On/Off ratio exceeds $10^5$, and in addition, both exhibit high mobility that exceeds 10 cm²/Vs. On the other hand, it was learned that Comparative Example 2 exhibited a normally-on characteristic when the threshold voltage was −10.5 V.

Generally, from the standpoint of a low amount of consumed electric power, a TFT that is normally-off is preferable over a TFT that is normally-on. It was learned that Experimental Example 1 is the TFT exhibiting the more preferable semiconductor characteristic.

This difference in the characteristics between the both is due to the method of the heat treatment, and the above-described results suggest that moisture contained in the heat treatment atmosphere induces excess carriers in the active layer.

Accordingly, it was learned that carrying out the heat treatment in a dry atmosphere is extremely effective for obtaining the desired semiconductor characteristics.

Further, from the comparison of the number of $H_2O$ molecules in the active layer film of the TFTs of Experimental Example 2 and Comparative Example 2, it was learned that, when there are greater than or equal to $4.4 \times 10^{20}$ cm$^{-3}$ $H_2O$ molecules within the active layer film, the TFT has a normally-on characteristic. Accordingly, it was learned that, in order to simultaneously realize high mobility and normally-off driving, it is effective to carry out the heat treatment in a dry atmosphere and to use, at the active layer, an oxide semiconductor thin film at which there are less than or equal to $4.2 \times 10^{20}$ cm$^{-3}$ $H_2O$ molecules within the film.

—Oxygen Partial Pressure at Time of Annealing and Introduced Oxygen Partial Pressure at Time of Active Layer Film Formation—

Next, evaluation of the TFT characteristics was carried out by systematically varying the oxygen partial pressure at the time of the heat treatment and the introduced oxygen partial pressure at the time of active layer film formation, in the heat treatment carried out in a dry atmosphere. Concretely, the following samples were fabricated, and evaluation of the TFT characteristics was carried out.

Experimental Examples 3 Through 8

Six samples were fabricated with only the annealing conditions differing from Experimental Example 1 and with the Ar/O₂ partial pressures at the time of the heat treatment being systematically varied to 100/0, 95/5, 90/10, 85/15, 80/20, 0/100 (namely, the oxygen partial pressure PO₂anneal was 0, 5, 10, 15, 20, 100% in order from the left for Experimental Examples 3 through 8).

Comparative Example 3

Further, a TFT, that was fabricated by carrying out the same fabrication process as Experimental Example 3 and carrying out wet annealing processing, was made to be Comparative Example 3.

Experimental Examples 9 Through 14

In Experimental Examples 9 through 14, the oxygen partial pressure at the time of active layer film formation and the oxygen partial pressure at the time of the heat treatment are varied from those of Experimental Example 1. The oxygen partial pressure at the time of active layer film formation is made to be 2.0%, and the other conditions, such as the composition and the like, are not varied. The sputtering conditions are the same as Experimental Example 1.

In addition, six samples, in which the oxygen partial pressure at the time of the heat treatment was systematically varied to 0, 5, 10, 15, 20, 100% (Experimental Examples 9 through 14 in order from the left), were fabricated.

Comparative Example 4

Further, a TFT, that was fabricated by carrying out the same fabrication process as Experimental Example 9 and carrying out wet annealing processing, was made to be Comparative Example 4.

Experimental Examples 15 through 20

In Experimental Examples 15 through 20, similarly, the introduced oxygen partial pressure at the time of active layer film formation and the oxygen partial pressure at the time of the heat treatment are varied. The oxygen partial pressure at the time of active layer film formation is made to be 6.3%, and the other conditions, such as the composition and the like, are not varied. The sputtering conditions are the same as Experimental Example 1.

In addition, six samples, in which the oxygen partial pressure at the time of the heat treatment was systematically varied to 0, 5, 10, 15, 20, 100% (Experimental Examples 15 through 20 in order from the left), were fabricated.

Comparative Example 5

Further, a TFT, that was fabricated by carrying out the same fabrication process as Experimental Example 15 and carrying out wet annealing processing, was made to be Comparative Example 5.

<Evaluation>

Figure 11A:
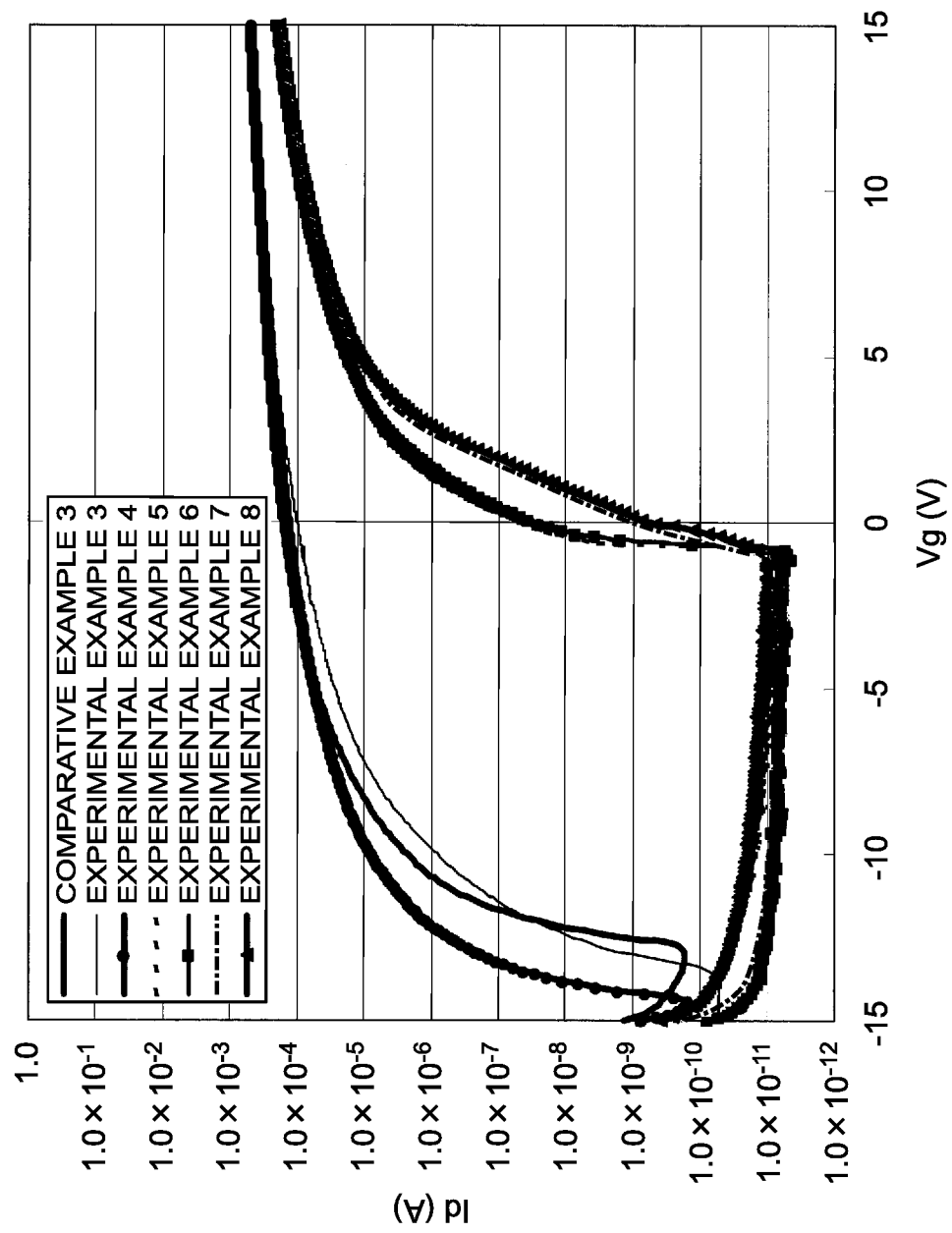
FIG. 11A is a drawing showing the Vg-Id characteristics in Experimental Examples 3 through 8 ($PO_2depo=0.50\%$).

Results of measuring the Vg-Id characteristics in these Examples 3 through 20 and Comparative Examples 3 through 5 are shown in FIGS. 11A through 11C. Further, the conditions of the oxygen partial pressure at the time of the heat treatment and the oxygen partial pressure at the time of active layer film formation, and the name of the sample, the threshold voltage and the field effect mobility are collectively shown in Table 4.

TABLE 4

| | | wet annealing (in the air) | oxygen partial pressure (%) at time of annealing | | | | | |
|---|---|---|---|---|---|---|---|---|
| | | | 0 | 5 | 10 | 15 | 20 | 100 |
| oxygen partial pressure (%) at time of film formation | 0.50 | Comp. Ex. 3 Vth: −10.5 μ: 19.5 | Exp. Ex. 3 Vth: −10.6 μ: 17.6 | Exp. Ex. 4 Vth: −13.0 μ: 16.6 | Exp. Ex. 5 Vth: 0.910 μ: 16.0 | Exp Ex. 6 Vth: 1.17 μ: 15.5 | Exp. Ex. 7 Vth: 1.92 μ: 14.8 | Exp. Ex. 8 Vth: 1.73 μ: 15.2 |
| | 2.0 | Comp. Ex. 4 could not be driven | Exp. Ex. 9 Vth: 0.407 μ: 15.4 | Exp. Ex. 10 Vth: 0.0355 μ: 17.9 | Exp. Ex. 11 Vth: 0.241 μ: 16.1 | Exp. Ex. 12 Vth: 1.53 μ: 15.7 | Exp. Ex. 13 Vth: 1.26 μ: 14.6 | Exp. Ex. 14 Vth: 1.49 μ: 15.7 |
| | 6.3 | Comp. Ex. 5 could not be driven | Exp. Ex. 15 Vth: 1.93 μ: 16.4 | Exp. Ex. 16 Vth: 2.1 μ: 12.3 | Exp. Ex. 17 Vth: 2.58 μ: 15.0 | Exp. Ex. 18 Vth: 2.18 μ: 12.5 | Exp. Ex. 19 Vth: 4.04 μ: 15.4 | Exp. Ex. 20 Vth: 13.5 μ: 4.84 × $10^{-4}$ |

From FIG. 11A through C and Table 4, and from the fact that normally-off elements were obtained in a wide range of oxygen partial pressures, it was learned that this is a characteristic controlling method having a broad process margin. In particular, depending on the film forming conditions of the active layer, normally-off elements were obtained even when oxygen was not included in the heat treatment atmosphere. This means that a heat treatment in a dry atmosphere is essentially effective in low-temperature processes.

Concretely, from the results shown in Table 4, it was learned that TFTs, that are normally-off and whose field effect mobility is greater than or equal to 10 cm$^2$/Vs, are in the range surrounded by the dotted lines shown in FIG. 12. Note that FIG. 12 is a drawing showing the relationship between oxygen partial pressure at the time of active layer film formation and oxygen partial pressure at the time of the heat treatment. Of the Experimental Examples of the present invention, the circle (O) in the drawing are the Examples, and the cross (X) are the Comparative Examples.

Further, it was learned that this range is expressed by a range in which the oxygen partial pressure PO$_2$anneal (%) at the time of the heat treatment step is $-20/3$PO$_2$depo$+40/3 \leq$ PO$_2$anneal $\leq -800/43$PO$_2$depo$+5900/43$, given that the oxygen partial pressure with respect to the entire pressure of the atmosphere within the film formation chamber in the film-forming step is PO$_2$depo (%) and the oxygen partial pressure with respect to the entire pressure of the atmosphere during the heat treatment step is PO$_2$anneal (%).

Further, in particular, the oxygen partial pressure PO$_2$depo (%) at the time of film formation being greater than or equal to 0.50% is preferable from the standpoint of the process margin and the standpoint that the oxygen partial pressure condition at which normally-off driving can be obtained is sufficiently broad.

Further, it was learned that, when the oxygen partial pressure PO$_2$depo (%) at the time of the active layer film formation is 6.3%, normally-off driving is obtained in all cases, but the mobility decreases when the oxygen partial pressure at the time of annealing is 100%. Accordingly, it is more preferable that the oxygen partial pressure PO$_2$depo (%) at the time of the active layer film formation is less than or equal to 6.3%.

—Lower Limit Value of Oxygen Partial Pressure at the Time of Active Layer Film Formation—

Next, the lower limit value of the oxygen partial pressure PO$_2$depo (%) at the time of the active layer film formation was determined by measuring the hole mobility of the IGZO film.

Experimental Example 21

In Experimental Example 21, without fabricating a TFT as described above, an IGZO film of a composition ratio of In:Ga:Zn=1:1:1 was formed on a substrate with the oxygen partial pressure PO$_2$depo (%) with respect to the entire pressure of the atmosphere within the film formation chamber being less than 0.17%. Then, the hole mobility of this formed film was measured. Similarly, without fabricating a TFT as described above, an IGZO film of a composition ratio of In:Ga:Zn=1:1:1 was formed on a substrate with the oxygen partial pressure PO$_2$depo (%) with respect to the entire pressure of the atmosphere within the film formation chamber being 0.50%. Then, the hole mobility of this formed film was measured.

The results of measuring the hole mobility of the two IGZO films are shown in Table

TABLE 5

| oxygen partial pressure (%) at time of film formation | hole mobility (cm$^2$/Vs) |
|---|---|
| less than 0.17 | 4.37 |
| 0.50 | 9.47 |

From Table 5, it was learned that, when a film is formed with the oxygen partial pressure at the time of film formation being less than 0.17%, the hole mobility is less than or equal to half, even with the same composition, as compared with a case in which a film is formed with the oxygen partial pressure being 0.50%. Therefore, it could be confirmed that it is preferable that the oxygen partial pressure at the time of film formation is greater than or equal to 0.17%, and further, from the standpoints of carrier concentration control and mobility, that it is more preferable that the oxygen partial pressure at the time of film formation is greater than or equal to 0.50%.

—Temperature Dependence at Time of Heat Treatment—

In order to corroborate that the heat treatment is effective even in different temperature ranges, samples in which the temperature at the time of the heat treatment was systematically varied were fabricated, and evaluation of the Vg-Id characteristics was carried out.

Experimental Examples 22 Through 24

Other than the heat treatment condition, the conditions were the same as those of Experimental Example 2, and the temperature of the heat treatment was made to be 150° C. The oxygen partial pressure at the time of the heat treatment was systematically made to be 10%, 20%, 100%, and these were Experimental Examples 22, 23, 24, respectively.

Experimental Examples 25 Through 27

Other than the heat treatment condition, the conditions were the same as those of Experimental Example 2, and the temperature of the heat treatment was made to be 200° C. The oxygen partial pressure at the time of the heat treatment was systematically made to be 10%, 20%, 100%, and these were Experimental Examples 25, 26, 27, respectively.

Experimental Examples 28 Through 30

Other than the heat treatment condition, the conditions were the same as those of Experimental Example 2, and the temperature of the heat treatment was made to be 250° C. The oxygen partial pressure at the time of the heat treatment was systematically made to be 10%, 20%, 100%, and these were Experimental Examples 28, 29, 30, respectively.

Experimental Example 31

Other than the heat treatment condition, the conditions were the same as those of Experimental Example 2, and the temperature of the heat treatment was made to be 300° C. The oxygen partial pressure at the time of the heat treatment was systematically made to be 20%, and this was Experimental Example 31.

Figure 13A:
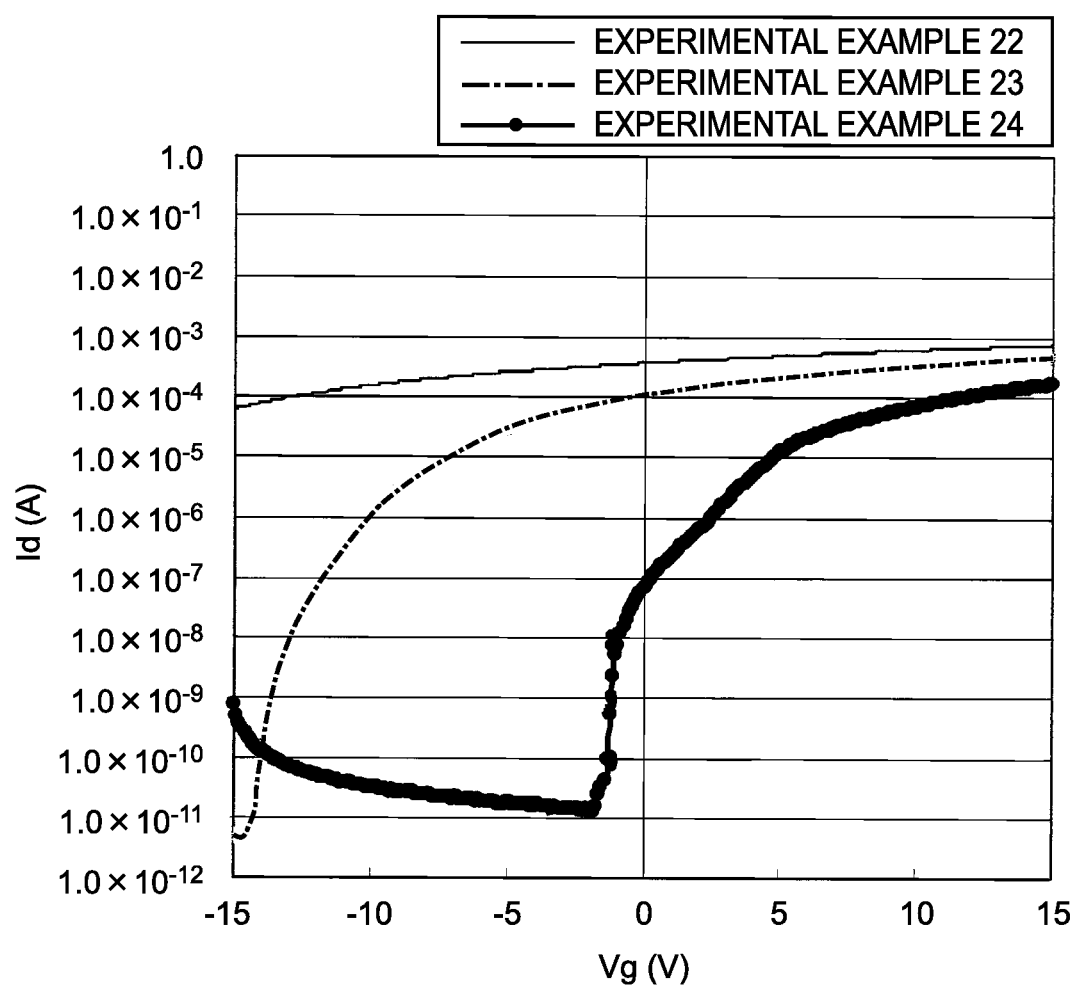
FIG. 13A is a drawing showing the Vg-Id characteristics in Experimental Examples 22 through 24 (annealing temperature 150° C.).
Figure 13C:
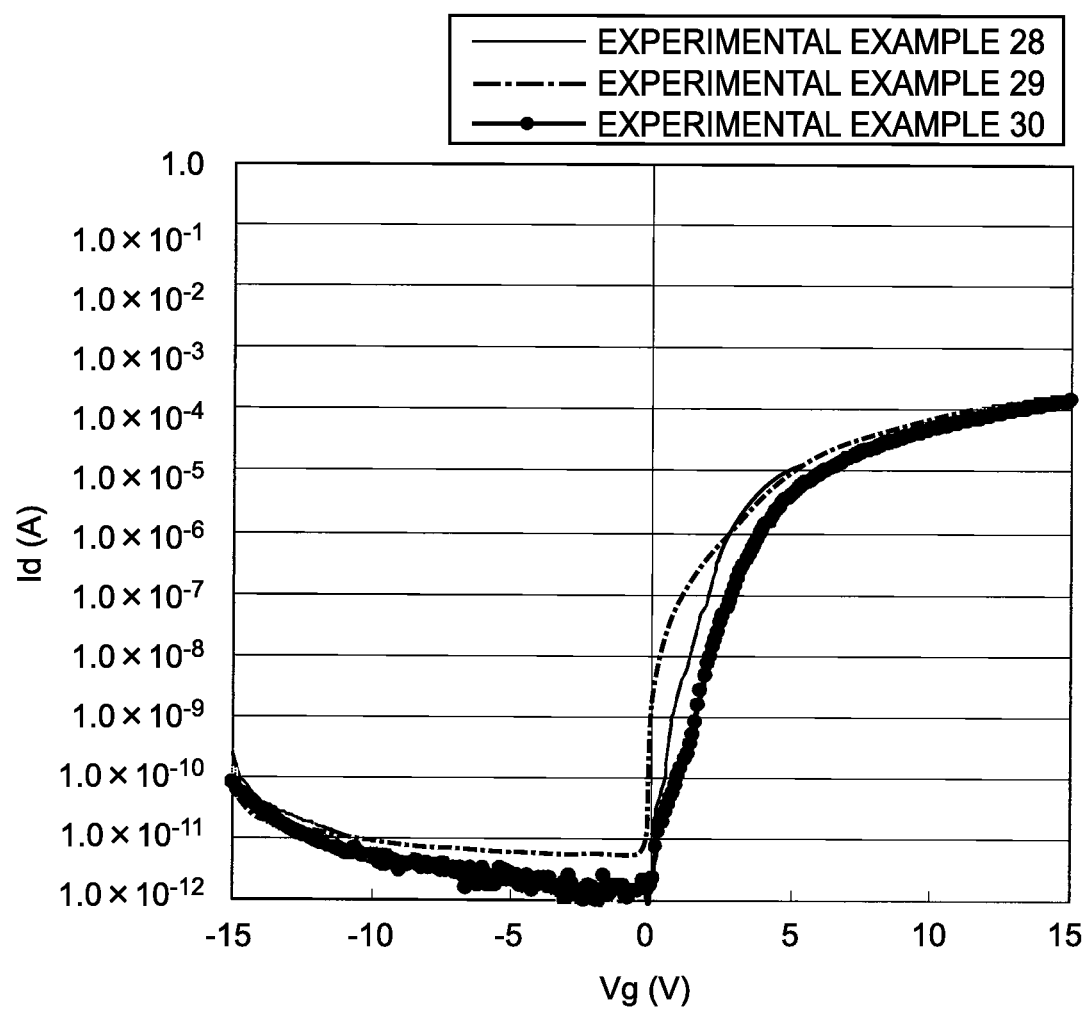
FIG. 13C is a drawing showing the Vg-Id characteristics in Experimental Examples 28 through 30 (annealing temperature 250° C.).

The results of carrying out measurement of the Vg-Id characteristics of these Experimental Examples 22 through 30 (excluding 31) are shown in FIGS. 13A through 13C. Further, the conditions of the temperature at the time of the heat treatment and the oxygen partial pressure at the time of the heat treatment, and the name of the sample, the threshold voltage and the mobility are collectively shown in Table 6.

TABLE 6

| | | oxygen partial pressure (%) at time of annealing | | |
|---|---|---|---|---|
| | | 10 | 20 | 100 |
| annealing temperature (° C.) | 150 | Exp. Ex. 22 Vth: −23.4 μ: 16.2 | Exp. Ex. 23 Vth: −11.0 μ: 16.2 | Exp. Ex. 24 Vth: 1.2 μ: 12.6 |
| | 200 | Exp. Ex. 25 Vth: 0.91 μ: 16.0 | Exp. Ex. 26 Vth: 1.92 μ: 14.8 | Exp. Ex. 27 Vth: 1.73 μ: 15.2 |
| | 250 | Exp. Ex. 28 Vth: 2.09 μ: 16.3 | Exp. Ex. 29 Vth: 1.37 μ: 14.8 | Exp. Ex. 30 Vth: 3.2 μ: 13.0 |
| | 300 | — | Exp. Ex. 31 Vth: 4.36 μ: 9.0 | — |

From FIGS. 13A through 13C and Table 6, it can be understood that transistors, that are normally-off and have the good TFT characteristic of a mobility of greater than or equal to 10 cm$^2$/Vs, can be obtained regardless of the heat treatment temperature, within a temperature range of greater than or equal to 150° C. and less than 300° C. under the condition of the oxygen partial pressure being 100% in particular. Accordingly, the desired semiconductor characteristics can be obtained in the wide temperature range of less than 300° C. by a heat treatment in a dry atmosphere. Note that, at 150° C., there were transistors that were not normally-off, but it can be thought that they would become normally-off if the compositions and film forming conditions were adjusted appropriately.

—Dependence on Composition of Active Layer—

Thus, in order to corroborate that the present invention is effective even in cases in which the composition of the active layer is different, samples in which the IGZO composition of the active layer was systematically varied were fabricated, and evaluation of the Vg-Id characteristic and mobility was carried out.

Experimental Examples 32 Through 36

Other than the composition of the active layer and the heat treatment condition, the conditions were the same as those of Experimental Example 2, and the temperature of the heat treatment was made to be 200° C. The oxygen partial pressure at the time of the heat treatment was made to be 20%, and the IGZO compositions were varied to 0.25, 0.375, 0.625, 0.75, 0.9 in the ratio of Ga/(In+Ga), and these were Experimental Examples 32 through 36, respectively.

TABLE 7

| | b/(a + b) | $V_{th}$ (V) | mobility (cm$^2$/Vs) | oxygen partial pressure PO$_2$depo (%) at time of film formation |
|---|---|---|---|---|
| Exp. Ex. 32 | 0.25 | −15.28 | 27.6 | 6.3 |
| Exp. Ex. 33 | 0.375 | 1.18 | 20.3 | 6.3 |
| Exp. Ex. 34 | 0.625 | 6.36 | 11.2 | 0.50 |
| Exp. Ex. 35 | 0.75 | 12.85 | 4.7 | 0.33 |
| Exp. Ex. 36 | 0.9 | 14.74 | 1.5 | 0.17 |

From the results shown in Table 7, it was learned that normally-off driving is possible under the condition of the Ga/(In+Ga) ratio being greater than or equal to 0.375 and less than or equal to 0.9, when considering only the composition and not considering the other conditions. Further, it was learned that normally-off driving and a field effect mobility of greater than or equal to 10 cm$^2$/Vs are obtained under the condition of the Ga/(In+Ga) ratio being greater than or equal to 0.375 and less than or equal to 0.625.

What is claimed is:

1. A method of fabricating a thin-film transistor, the method comprising:
   a) film-forming an active layer, that contains as a main component thereof an oxide semiconductor structured by O and at least two elements among In, Ga and Zn, in a film formation chamber into which at least oxygen is introduced, and
   b) heat treating the active layer at less than 300° C. in a dry atmosphere,
   wherein the film-forming a) and the heat treating b) are carried out such that, given that an oxygen partial pressure with respect to an entire pressure of an atmosphere within the film formation chamber in the film-forming a) is PO$_2$depo (%), and an oxygen partial pressure with respect to an entire pressure of an atmosphere during the heat treating b) satisfies a relationship: $-20/3 PO_2 depo + 40/3 \leq PO_2 anneal \leq -800/43 PO_2 depo + 5900/43$
   wherein a number of H$_2$O molecules, observed by thermal desorption spectrometry, of the active layer is less than or equal to $4.2 \leq 10^{20}$ cm$^{-3}$, and
   wherein the dry atmosphere is a condition wherein a moisture content of an entire atmosphere in the film formation chamber is less than or equal to an absolute humidity of 0.21 g/m$^3$, −36° C. dew point temperature.

2. The method of fabricating a thin-film transistor of claim 1, wherein, in the film-forming a), the oxygen partial pressure $PO_2$depo is greater than or equal to 0.17%.

3. The method of fabricating a thin-film transistor of claim 2, wherein, in the film-forming a), the oxygen partial pressure $PO_2$depo is greater than or equal to 0.50%.

4. The method of fabricating a thin-film transistor of claim 1, wherein, in the film-forming a), the oxygen partial pressure $PO_2$depo is less than or equal to 6.3%.

5. The method of fabricating a thin-film transistor of claim 1, wherein, in the heat treating b), a heat treatment temperature exceeds 150° C.

6. The method of fabricating a thin-film transistor of claim 1, wherein, in the heat treating b), a heat treatment temperature is less than or equal to 250° C.

7. The method of fabricating a thin-film transistor of claim 1, wherein the oxide semiconductor is structured of In, Ga, Zn and O, and a mol ratio of the Ga with respect to a total of a mol ratio of the In and the mol ratio of the Ga satisfies a relationship $0.375 \leq Ga(In+Ga) \leq 0.625$.

8. The method of fabricating a thin-film transistor of claim 1, wherein, in the film-forming a), the active layer is film-formed by a sputtering method.

9. The thin-film transistor of claim 1, wherein the active layer is formed on a substrate that is flexible.

10. A display device comprising the thin-film transistor of claim 1.

11. A sensor comprising the thin-film transistor of claim 1.

12. An X-ray digital imaging device comprising the sensor of claim 11.

13. A method of fabricating a thin-film transistor, the method comprising:
   a) film-forming an active layer, that contains as a main component thereof an oxide semiconductor structured by O and at least two elements among In, Ga and Zn, in a film formation chamber into which at least oxygen is introduced, and
   b) heat treating the active layer at less than 300° C. in a dry atmosphere,
   wherein the film-forming a) and the heat treating b) are carried out such that, given that an oxygen partial pressure with respect to an entire pressure of an atmosphere within the film formation chamber in the film-forming a) is $PO_2$depo (%), and an oxygen partial pressure with respect to an entire pressure of an atmosphere during the heat treating b) satisfies a relationship: $-20/3 PO_2depo + 40/3 \leq PO_2anneal \leq -800/43 PO_2depo + 5900/43$
   c) after the heat treatment, forming electrodes were formed, and
   wherein the dry atmosphere is a condition wherein a moisture content of an entire atmosphere in the film formation chamber is less than or equal to an absolute humidity of 0.21 $g/m^3$, −36° C. dew point temperature.

14. The method of fabricating a thin-film transistor of claim 13, wherein, in the heat treating b), a heat treatment temperature is less than or equal to 200° C.

* * * * *